US012771299B2

(12) United States Patent
Jin et al.

(10) Patent No.: US 12,771,299 B2
(45) Date of Patent: Oct. 20, 2026

(54) MULTIBAND DOHERTY POWER AMPLIFIER ARRANGEMENTS WITH HYBRID COMBINERS

(71) Applicant: Telefonaktiebolaget LM Ericsson (publ), Stockholm (SE)

(72) Inventors: Yonghai Jin, Beijing (CN); Rui Hou, Täby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 425 days.

(21) Appl. No.: 18/574,361

(22) PCT Filed: Jul. 1, 2021

(86) PCT No.: PCT/CN2021/103930
§ 371 (c)(1),
(2) Date: Dec. 27, 2023

(87) PCT Pub. No.: WO2023/272671
PCT Pub. Date: Jan. 5, 2023

(65) Prior Publication Data
US 2024/0297620 A1 Sep. 5, 2024

(51) Int. Cl.
*H03F 3/24* (2006.01)
*H03F 1/02* (2006.01)
(Continued)

(52) U.S. Cl.
CPC ........... *H03F 1/0288* (2013.01); *H03F 3/245* (2013.01); *H03F 3/602* (2013.01); *H03F 1/56* (2013.01);
(Continued)

(58) Field of Classification Search
CPC ........ H03F 1/0288; H03F 3/245; H03F 3/602; H03F 1/56; H03F 2200/111;
(Continued)

(56) References Cited

U.S. PATENT DOCUMENTS 7,301,395 B2 * 11/2007 Mobbs .................. H03F 1/0288 330/53
9,634,615 B1 4/2017 Ahmed et al.
(Continued)

FOREIGN PATENT DOCUMENTS

CN 102986134 A 3/2013
CN 108134580 A 6/2018
(Continued)

OTHER PUBLICATIONS

International Search Report and Written Opinion of the International Searching Authority, PCT/CN2021/103930, mailed Feb. 25, 2022, 7 pages.
(Continued)

*Primary Examiner* — Jessica Han
*Assistant Examiner* — Khiem D Nguyen
(74) *Attorney, Agent, or Firm* — Sage Patent Group

(57) ABSTRACT

A power amplifier arrangement for amplifying signals with multiple frequency bands. The power amplifier arrangement includes multiple inputs, multiple outputs, multiple main amplifiers, and multiple auxiliary amplifiers. Each of the multiple main amplifiers is configured as a narrow band amplifier for amplifying a signal within one frequency band of the multiple frequency bands, each auxiliary amplifier is configured as a wideband amplifier for amplifying signals within at least two frequency bands of the multiple frequency bands. The power amplifier arrangement further includes one or more input hybrid couplers and one or more output hybrid couplers.

16 Claims, 20 Drawing Sheets

300

(51) Int. Cl.
*H03F 3/60* (2006.01)
*H03F 1/56* (2006.01)

(52) U.S. Cl.
CPC .. *H03F 2200/111* (2013.01); *H03F 2200/192* (2013.01); *H03F 2200/204* (2013.01)

(58) Field of Classification Search
CPC ......... H03F 2200/192; H03F 2200/204; H03F 2200/429; H03F 1/42; H03F 3/68; H03F 3/72; H03F 2200/198; H03F 2200/451; H03F 3/195; H01P 5/12
See application file for complete search history.

(56) References Cited

U.S. PATENT DOCUMENTS

| | | | | |
|---|---|---|---|---|
| 2011/0140775 | A1* | 6/2011 | Hong | H03F 3/602 330/124 R |
| 2015/0091653 | A1 | 4/2015 | Kobayashi et al. | |
| 2018/0091100 | A1 | 3/2018 | Wey | |

FOREIGN PATENT DOCUMENTS

| | | | |
|---|---|---|---|
| EP | 2713505 | A2 | 4/2014 |
| EP | 2713505 | B1 | 12/2018 |

OTHER PUBLICATIONS

Chen, Shichang et al., "Wide-band/Multi-band Doherty and outphasing power amplifier designs," Proceedings of the 1st European Microwave Conference in Central Europe (EuMCE), Oct. 17, 2019, 4 pages.

Pang, Jingzhou et al., "Novel Design of Highly-efficient Concurrent Dual-band GaN Doherty Power Amplifier Using Direct-Matching Impedance Transformers," 2016 IEEE MTT-S International Microwave Symposium (IMS), San Francisco, CA, USA, 4 pages.

Extended European Search Report, European Patent Application No. 21947624.9, mailed Jan. 31, 2025, 6 pages.

* cited by examiner

100

700

1000

MULTIBAND DOHERTY POWER AMPLIFIER ARRANGEMENTS WITH HYBRID COMBINERS

CROSS REFERENCE TO RELATED APPLICATIONS

This application is a 35 U.S.C. § 371 national stage application of PCT International Application No. PCT/CN2021/103930 filed on Jul. 1, 2021, the disclosure and content of which is incorporated by reference herein in its entirety.

TECHNICAL FIELD

Embodiments herein relate to power amplifier arrangements. In particular, they relate to multiband Doherty power amplifiers with hybrid combiners, an electronic apparatus comprising one or more multiband Doherty power amplifiers.

BACKGROUND

With the rapid development of communication technologies, mobile communication systems have to accommodate many standards simultaneously. This requirement stimulates the demand for multiband power amplifiers (PA). In the conventional multiband PA solution, several single band PAs are paralleled, and the outputs of each PA are added together using passive combiners or multiplexers. These architectures will lead to a significant power loss.

Although a classic Doherty PA meets the efficiency and linearity requirements, it is an inherent narrow-band solution, because of the use of frequency limited quarter wave transmission lines. Therefore, it may not satisfy the broadband requirements with emerging wireless standards. A clear source of limited bandwidth in the Doherty PA is the impedance inverter which connects the carrier and peaking amplifier together.

To support multiband requirements, broadband high efficiency PA technology is developed recently. However the efficiency of the broadband PA solution is still lower than the narrow band Doherty PA (DPA). That is because the bandwidth and efficiency are trade off performances in PA design. Multiband DPA disclosed in JingZhou Pang et. al, "Novel design of highly-efficiency concurrent dual-band GaN Doherty power amplifier using direct-matching impedance transformers", 2016 IEEE MTT-S International Microwave Symposium (IMS), has the potential to achieve comparative performance with the conventional narrow band DPAs. However, when it works in concurrent dual band mode, the efficiency will be dropped comparing to single band mode due to a lots of intermodulation signal power coming out when different band signals input into one PA.

One alternative solution is proposed in EP2713505. Two narrow band main PAs with one wideband auxiliary PA combined to support multiband application. In practical radio units with PA used for cellular base stations, the loading of a multiband power amplifier is often not a wideband load impedance, but many narrow-band band-pass filters. This means for N operating frequency bands, the PA loading are N bandpass filters. For the prior art solution in EP2713505, the output from the PA is a wideband signal. It requires a 1-to-N multiplexer to divide the wideband output signal from the PA to feed the N narrow-band filters. This 1-to-N multiplexer causes extra insertion loss, volume, and weight.

SUMMARY

It is therefore an object of embodiments herein to provide a high efficiency multiband power amplifier.

According to one aspect of embodiments herein, the object is achieved by a power amplifier arrangement for amplifying signals with multiple frequency bands. The power amplifier arrangement comprises multiple inputs and multiple outputs, each input is for receiving an input signal within one frequency band of the multiple frequency bands, each output is for providing an output signal within one frequency band of the multiple frequency bands.

The power amplifier arrangement further comprises multiple main amplifiers, each of the multiple main amplifiers is configured as a narrow band amplifier for amplifying a signal within one frequency band of the multiple frequency bands. Inputs of the multiple main amplifiers are coupled to the respective inputs of the power amplifier arrangement for receiving the input signals within the respective frequency bands. Outputs of the multiple main amplifiers are coupled to the respective outputs of the power amplifier arrangement for providing the output signals within the respective frequency bands.

The power amplifier arrangement further comprises multiple auxiliary amplifiers. Each auxiliary amplifier is configured as a wideband amplifier for amplifying signals within at least two frequency bands of the multiple frequency bands.

The power amplifier arrangement further comprises one or more input hybrid couplers at the inputs and one or more output hybrid couplers at the outputs of the power amplifier arrangement.

An input of an auxiliary amplifier is coupled to one of the multiple inputs of the power amplifier arrangement through one or more input hybrid couplers. An output of an auxiliary amplifier is coupled to one of the multiple outputs of the power amplifier arrangement through one or more output hybrid couplers such that an output signal from that auxiliary amplifier is split into different output signals within different frequency bands, and the signals within the same frequency band output from the main amplifier and auxiliary amplifier are combined in-phase at the output of the power amplifier arrangement for providing the output signal within that frequency band.

In other words, the power amplifier arrangement according to the embodiments herein comprises multiple narrow band main PAs and multiple wideband auxiliary PAs with multiple narrow band output ports. For each output port, narrow band main PA works at high efficiency status as conventional narrow band DPAs, wideband auxiliary PAs are sharing for signals with different bands which can support multiband power pooling application. The power pooling means that radio frequency signal power may be dynamically allocated to different frequency bands according to actual communication traffic needs. For example, two frequency bands may be covered by two stand-alone PAs, each with 10 W power capacity. Then the maximum power per band cannot exceed 10 W. Alternatively, a single 20 W dual-band PA may be used to cover these two bands, then the power configuration between the two bands may be more flexible, e.g. 10 W+10 W or 15 W+5 W according to real-time communication traffic needs. With hybrid combiners, it's easy to divide the signals with different bands for different bands output ports.

According to the embodiments herein, the power amplifier arrangement has N multiple narrow band outputs. The output signal power from the N narrow band main PAs and the wideband auxiliary PAs are combined at N different combining points, in contrast to the single power combining point in prior art EP2713505. This removes the need of a 1-to-N multiplexer at the PA output for feeding N narrow-band filters, therefore reduces the insertion loss, volume, and weight of the radio units with PAs.

Therefore, the power amplifier arrangement according to the embodiments herein is a multiband power amplifier with high efficiency.

BRIEF DESCRIPTION OF THE DRAWINGS

Examples of embodiments herein are described in more detail with reference to attached drawings in which.

DETAILED DESCRIPTION

Figure 1A:
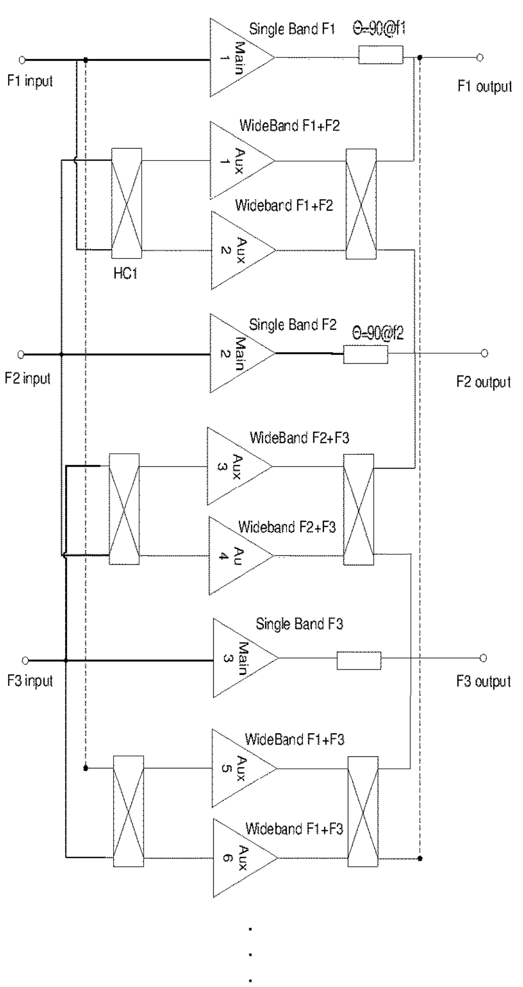
FIGS. 1 *a* and 1*b* are general structures illustrating a power amplifier arrangement according to embodiments herein.
Figure 1B:
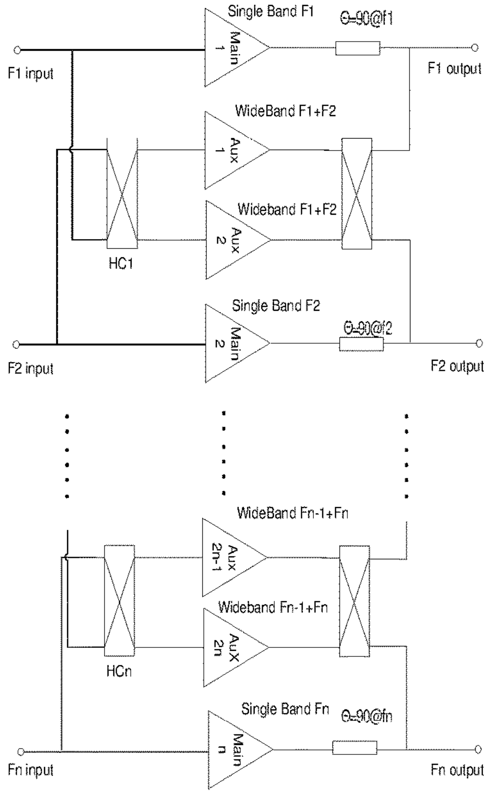

FIGS. 1*a* and 1*b* show general structures for a power amplifier arrangement 100 according to embodiments herein for amplifying signals with multiple frequency bands F1, F2, F3, . . . Fn. The power amplifier arrangement 100 comprises multiple inputs F1 input, F2 input, . . . Fn input, and multiple outputs F1 output, F2 output, . . . Fn output.

Each input is for receiving an input signal within one frequency band of the multiple frequency bands F1, F2, F3 . . . Fn.

Each output is for providing an output signal within one frequency band of the multiple frequency bands F1, F2, F3 . . . Fn.

The power amplifier arrangement 100 further comprises multiple main amplifiers Main 1, Main 2, . . . Main n. Each of the multiple main amplifiers is configured as a narrow band amplifier for amplifying a signal within one frequency band of the multiple frequency bands F1, F2, F3 . . . Fn. For example, the first main amplifier Main 1 is for amplifying the signal within the first frequency band F1.

Inputs of the multiple main amplifiers are coupled to the respective inputs of the power amplifier arrangement 100 for receiving the input signals within the respective frequency bands and outputs of the multiple main amplifiers are coupled to the respective outputs of the power amplifier arrangement 100 for providing the output signals within the respective frequency bands. For example, the input of the first main amplifier Main 1 is coupled to the first input F1 input of the power amplifier arrangement 100 to receive the signal within the first frequency band F1, the output of the first main amplifier Main 1 is coupled to the first output F1 output of the power amplifier arrangement 100.

The power amplifier arrangement 100 further comprises multiple auxiliary amplifiers Aux 1, Aux 2 . . . , Aux 2*n*−1, Aux 2*n* Each auxiliary amplifier is configured as a wideband amplifier for amplifying signals within at least two frequency bands F1+F2, . . . F2+F3 . . . of the multiple frequency bands F1, F2, F3, . . . Fn. For example, the first and second auxiliary amplifiers Aux 1, 2 are for amplifying the signal within the first and second frequency bands F1+F2.

The power amplifier arrangement 100 further comprises one or more hybrid couplers at the inputs and one or more hybrid couplers at the outputs of the power amplifier arrangement 100.

An input of an auxiliary amplifier is coupled to one of the multiple inputs of the power amplifier arrangement 100 through one or more hybrid couplers to receive the input signals within at least two frequency bands.

For example, the first input signal within the first frequency band F1 is input to the first and second auxiliary amplifiers Aux 1, Aux 2 through a first hybrid coupler HC1.

An output of an auxiliary amplifier is coupled to one of the multiple outputs of the power amplifier arrangement 100 through one or more hybrid couplers such that an output signal from that auxiliary amplifier is split into different output signals within different frequency bands, and the signals within the same frequency band output from the main amplifier and auxiliary amplifier are combined in-phase at the output of the power amplifier arrangement for providing the output signal within that frequency band.

As shown in FIG. 1, the outputs of the multiple main amplifiers are coupled to the respective outputs of the power amplifier arrangement 100 through respective transmission lines for impedance matching and phase compensation.

A two-way DPA comprises of at least two PA branches, namely a class AB biased main and a class-C biased auxiliary branch. The main amplifier is always in the "on" state. Whereas, the auxiliary amplifier is in the "on" state only when the input-power is large, this provides additional power in the high-power region. Therefore, in operation, the auxiliary PA modulates the effective load impedance of the main PA in a specific pattern, hereafter referred to as Doherty load modulation, such that total efficiency is improved also at the average or back-off power level.

Two main amplifiers and two auxiliary amplifiers in between these two main amplifiers in the power amplifier arrangement 100 may form a branch of two-way Doherty power amplifier and operates in the similar way as the two-way Doherty power amplifier to achieve high efficiency over a wide output power range. Each branch of two-way Doherty power amplifier may operate as a dual-band power amplifier.

Therefore, the power amplifier arrangement 100 is a multiband Doherty power amplifier (DPA). Each of the multiple main amplifiers may be configured to amplify an input signal with a full power range and each of the multiple auxiliary amplifiers may be configured to amplify the input signal with a power range above a threshold.

Figure 2A:
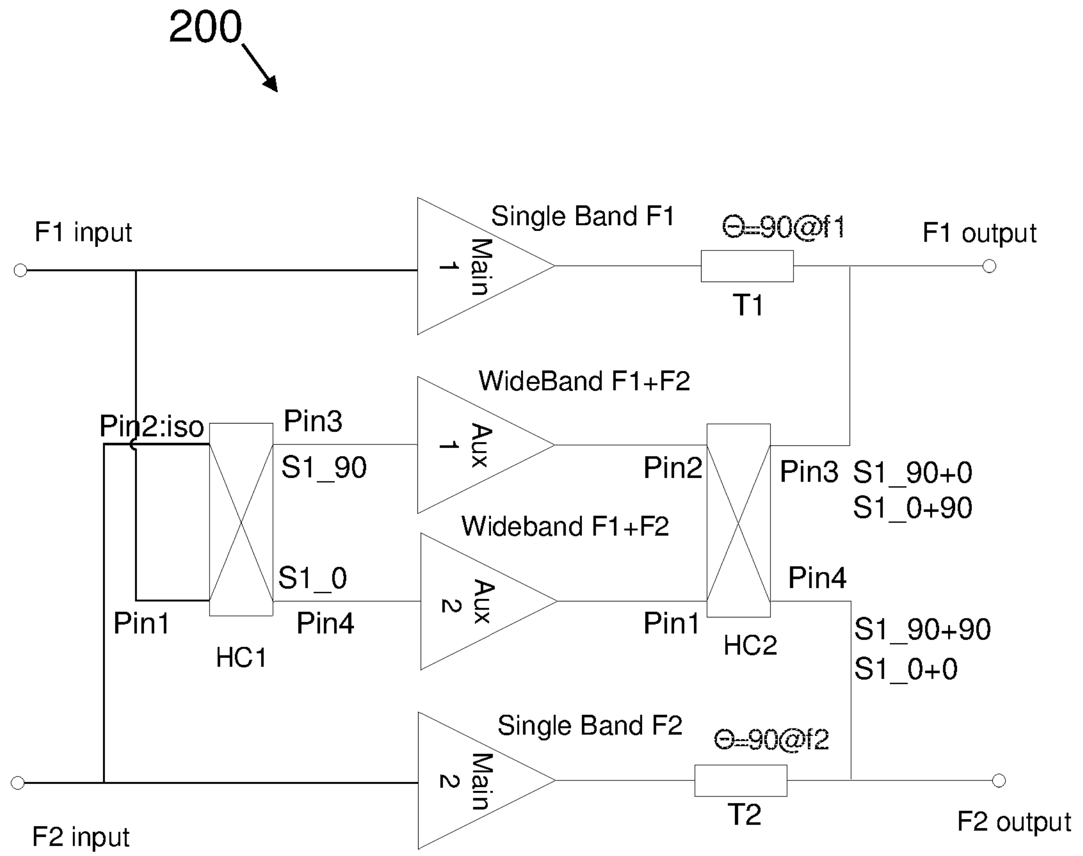
FIGS. 2*a* and 2*b* are simplified basic structures of a power amplifier arrangement according to embodiments herein.

To illustrate the function and operation of the power amplifier arrangement 100 according to embodiments herein, a schematic of a dual-band power amplifier arrangement 200, i.e. a branch of two-way Doherty power amplifier from the power amplifier arrangement 100, is shown in FIG. 2*a*.

The power amplifier arrangement 200 comprises:

- a first input F1 input for receiving a first input signal within a first frequency band F1;
- a first output F1 output for providing a first output signal within the first frequency band F1;
- a second input F2 input for receiving a second input signal within a second frequency band F2; and
- a second output F2 output for providing a second output signal within the second frequency band F2.

The power amplifier arrangement 200 further comprises:

- a first main amplifier Main 1, an input of the first main amplifier is coupled to the first input F1 input of the power amplifier arrangement 200 and an output of the first main amplifier is coupled to the first output F1 output of the power amplifier arrangement 200 through a first transmission line T1, and the first main amplifier is configured as a narrow band amplifier to amplify the first input signal within the first frequency band F1 with a full power range; and
- a second main amplifier Main 2, an input of the second main amplifier is coupled to the second input F2 input of the power amplifier arrangement 200 and an output of the second main amplifier is coupled to the second output F2 output of the power amplifier arrangement 200 through a second transmission line T2, and the second main amplifier is configured as a narrowband amplifier to amplify the second input signal within the second frequency band F2 with a full power range.

The power amplifier arrangement 200 further comprises:

- a first auxiliary amplifier Aux 1 configured as a wideband amplifier to amplify the first and second input signals within the first and second frequency bands F1, F2, with a power range above a threshold; and
- a second auxiliary amplifier Aux 2 configured as a wideband amplifier to amplify the first and second input signals within the first and second frequency bands F1, F2, with a power range above a threshold.

The power amplifier arrangement 200 further comprises a first hybrid coupler HC1 and a second hybrid coupler HC2. Each hybrid coupler has four terminals or pins Pin1, Pin2, Pin3, Pin4.

Inputs of the auxiliary amplifiers are coupled to the inputs of the power amplifier arrangement 200 through the first hybrid coupler HC1, outputs of the auxiliary amplifiers are coupled to the outputs of the power amplifier arrangement 200 through the second hybrid coupler HC2, e.g. in the following way:

The first terminal Pin1 of the first hybrid coupler HC1 is coupled to the first input F1 input of the power amplifier arrangement 200.

The second terminal Pin2 of the first hybrid coupler HC1 is coupled to the second input F2 input of the power amplifier arrangement 200.

The third terminal Pin3 of the first hybrid coupler HC1 is coupled to an input of the first auxiliary amplifier Aux 1.

The fourth terminal Pin4 of the first hybrid coupler HC1 is coupled to an input of the second auxiliary amplifier Aux 2.

The first terminal Pin1 of the second hybrid coupler HC2 is coupled to an output of the second auxiliary amplifier Aux 2.

The second terminal Pin2 of the second hybrid coupler HC2 is coupled to an output of the first auxiliary amplifier Aux 1.

The third terminal Pin3 of the second hybrid coupler HC2 is coupled to the first output F1 output of the power amplifier arrangement 200.

The fourth terminal Pin4 of the second hybrid coupler HC2 is coupled to the second output F2 output of the power amplifier arrangement 200.

Table 1 shows the pin configurations for a hybrid coupler. Each pin may be chosen as an input or output terminal. Once a pin is chosen as the input terminal for a signal, the outputs for the signal and the phase relations from the input to the outputs for the signal are fixed, as shown in Table 1.

TABLE 1

| Pin 1 | Pin 2 | Pin 3 | Pin 4 |
|---|---|---|---|
| input | isolation | Δ90° | Δ0° |
| isolation | input | Δ0° | Δ90° |
| Δ90° | Δ0° | input | isolation |
| Δ0° | Δ90° | isolation | input |

For example, if Pin1 is chosen as an input terminal for the first signal, then Pin2 is an isolation terminal for the first signal, i.e. the first signal can't come out from Pin2, Pin3 is an output terminal for the first signal with 90 degree phase change, and Pin4 is an output terminal for the first signal with 0 degree phase change.

For another example, if Pin2 is chosen as an input terminal for the second signal, then Pin1 is an isolation terminal for the second signal, i.e. the second signal can't come out from Pin1, Pin3 is an output terminal for the second signal with 0 degree phase change, and Pin4 is an output terminal for the second signal with 90 degree phase change.

With these pin configurations in mind, the operation of the power amplifier arrangement 200 will be described in detail with reference to FIG. 2*a*, where the phase relation for the first signal is noted at each terminal of the first and second hybrid couplers.

During operation, the first input signal within the first frequency band F1 is input to the first terminal Pin1 of the first hybrid coupler HC1. The first input signal is split to two signals by the first hybrid coupler HC1, one is output at the third terminal Pin3 with 90 degrees phase change, noted with S1_90, and one is output at the fourth terminal Pin4 with 0 degrees phase change, noted with S1_0.

The signal with 90 degrees phase change, S1_90, is input to the first auxiliary amplifier Aux 1 to get amplified. The amplified signal with 90 degrees phase change is input to the second terminal Pin2 of the second hybrid coupler HC2 and split to two signals by the second hybrid coupler HC2. One is output at the third terminal Pin3 with 0 degrees phase change, noted with S1_90+0, and one is output at the fourth terminal Pin4 with 90 degrees phase change, noted with S1_90+90.

The signal with 0 degrees phase change, S_0, is input to the second auxiliary amplifier Aux 2 to get amplified. The amplified signal with 0 degrees phase change is input to the first terminal Pin1 of the second hybrid coupler HC2 and split to two signals by the second hybrid coupler HC2. One is output at the third terminal Pin3 with 90 degrees phase change, noted with S1_0+90, and one is output at the fourth terminal Pin4 with 0 degrees phase change, noted with S1_0+0.

Finally, signals S1_0+90 and S1_90+0 are combined in phase at Pin3 of HC2 and signals S1_0+0 and S1_90+90 are cancelled at Pin4 of HC2 due to opposite phase. That means if a signal input from Pin1 of HC1, it will finally output from Pin3 of HC2. Similarly, if a signal input from Pin2 of HC1, it will finally output from Pin4 of HC2.

Therefore, the amplified signals from both the first and second auxiliary amplifiers are input to the second hybrid coupler HC2 and after being split by the second hybrid coupler HC2 with different phase change, both the amplified signals output at the third terminal Pin3 of the second hybrid coupler HC2 have a phase change of 90 degrees in total compared to the first input signal. Both the amplified signals output at the fourth terminal Pin4 of the second hybrid coupler HC2 have a phase change of 0 or 180 degrees in total compared to the first input signal.

The output signals from the third terminal Pin3 of the second hybrid coupler HC2 are combined with the amplified signal from the first main amplifier Main 1 through the first transmission line T1 with 90 degrees phase change. That is the signals within the first frequency band F1 output from the first main amplifier, the first and second auxiliary amplifiers are combined in-phase at the first output of the power amplifier arrangement 200 for providing the output signal within the first frequency band.

The similar operation applies for the second input signal within the second frequency band F2. The second input signal is input to the second terminal Pin2 of the first hybrid coupler HC1 and split to two signals with 0 and 90 degrees phase change and input to the first and second auxiliary amplifiers respectively. The amplified signals from both the first and second auxiliary amplifiers are input to the second hybrid coupler HC2 and after being split by the second hybrid coupler HC2 with different phase change, both the amplified signals output at the fourth terminal Pin4 of the second hybrid coupler HC2 have a phase change of 90 degrees in total compared to the second input signal. Both the amplified signals output at the third terminal Pin3 of the second hybrid coupler HC2 have a phase change of 0 or 180 degrees in total compared to the second input signal.

The output signals from the fourth terminal Pin4 of the second hybrid coupler HC2 are combined with the amplified signal from the second main amplifier Main 2 through the second transmission line T2 with 90 degrees phase change. That is the signals within the second frequency band F2 output from the second main amplifier, the first and second auxiliary amplifiers are combined in-phase at the second output of the power amplifier arrangement 200 for providing the output signal within the second frequency band F2.

Notice that, there is no output signal within the first frequency band F1 from the fourth terminal Pin4 of the second hybrid coupler HC2 in ideal case. As seen from FIG. 2*a*, two amplified signals within the first frequency band F1 come to Pin4 with opposite phase 0/180 and will be cancelled each other if the signal amplitude is same. The same for the third terminal Pin3 of the second hybrid coupler HC2, there is no output signal within the second frequency band F2 from the third terminal Pin3 of the second hybrid coupler HC2.

The 90 degrees transmission lines T1 and T2 shown in FIG. 2 are only exemplary in an ideal situation, for the functionality of an impedance inverter. The notation θ=90@f1, θ=90@f2 in FIG. 2 on the transmission lines means a quarter wavelength transmission line for frequency F1 or F2, i.e. a signal with frequency F1 or F2 can go through this transmission line with phase change 90 degrees. It's well known for the people skilled in the art that in practice, due to parasitic effects, transmission lines of other lengths will be used to achieve the impedance inversion function.

Figure 2B:
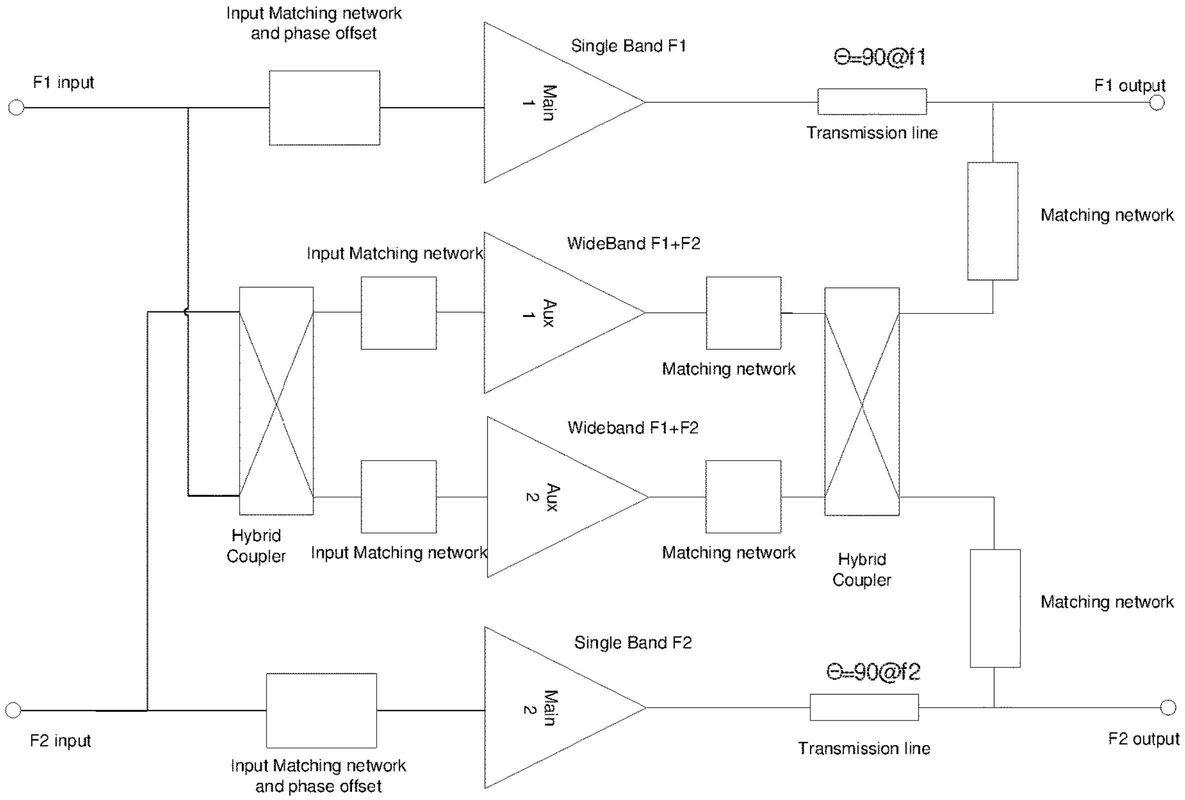

FIG. 2*a* is only a basic principle structure of a dual-band power amplifier. In practical applications, matching networks or phase offset networks are always needed at the input and output of each auxiliary amplifier, between the outputs of a hybrid coupler and the outputs of the power amplifier arrangement, at the input of each main amplifier etc. to compensate the phase differences between the main and auxiliary amplifiers for the input signals to the input hybrid coupler HC1 and the output signals from the output hybrid coupler HC2, as shown in FIG. 2*b*.

Figure 3A:
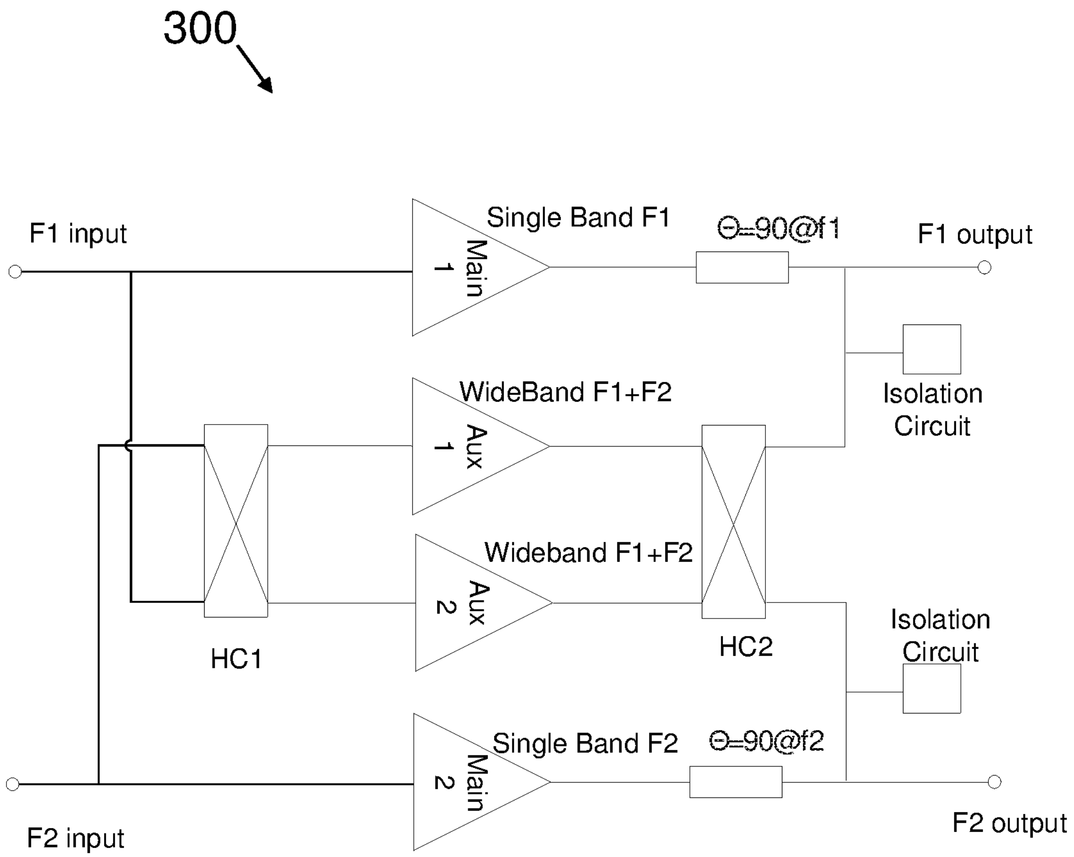
FIG. 3*a* is a simplified basic structure of a power amplifier arrangement with isolation circuits according to embodiments herein.
Figure 3B:
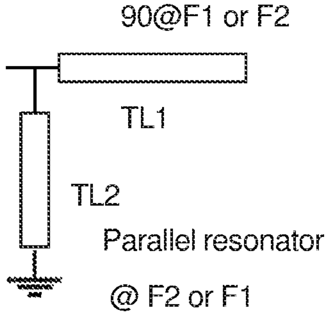
FIGS. 3*b*, 3*c*, and 3*d* are example isolation circuits.
Figure 3C:
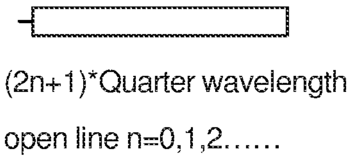
Figure 3D:

In order to filter out unwanted signal or short the unwanted signal to ground from the outputs of the power amplifier arrangement 100, 200, each output may comprise an isolation circuit or a short circuit as shown in FIG. 3*a*. The isolation circuit may be a parallel resonator comprising two transmission lines TL1, TL2 as shown in FIG. 3*b*, or a (2*n*+1)*Quarter wavelength open transmission line, n=0, 1, 2, . . . as shown in FIG. 3*c*, or a series Inductor-Capacitor (LC) resonance circuit, as shown in FIG. 3*d*.

The isolation circuit is short to ground for the signal at the resonance frequency of the isolation circuit, so it can isolate the leakage signal which should go out to another output port.

Therefore, according to some embodiment herein, the power amplifier arrangement 100, 200 may comprise multiple isolation resonation circuits coupled to the respective outputs of the power amplifier arrangement 100, 200. Each resonation isolation circuit is configured to resonance at a certain frequency to filter out the signal with this frequency from the output of the power amplifier arrangement.

Figure 4A:
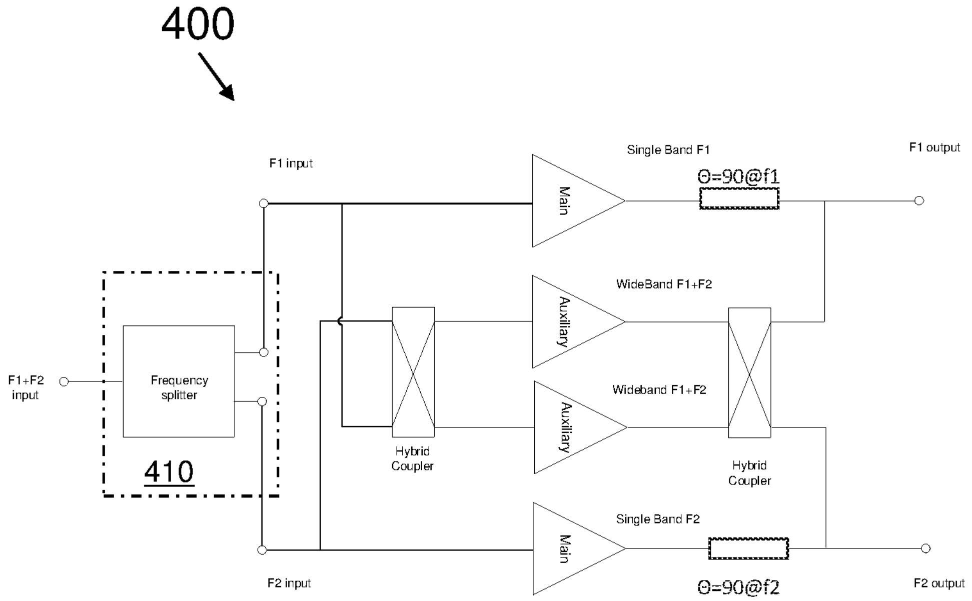
FIG. 4*a* is a simplified basic structure of a power amplifier arrangement with a signal splitter.
Figure 4B:
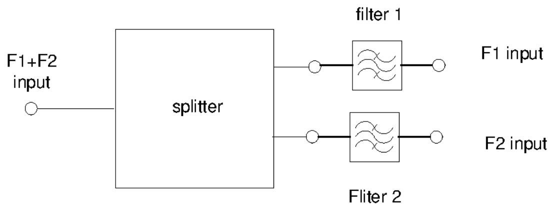
FIGS. 4*b*, 4*c*, 4*d*, and 4*e* are examples of signal splitters.
Figure 4C:
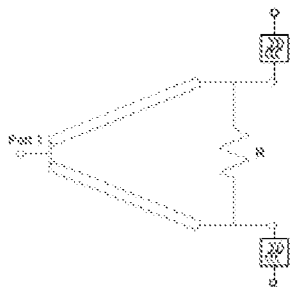
Figure 4D:
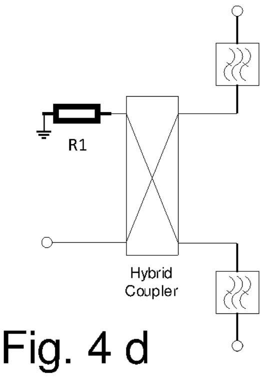
Figure 4E:
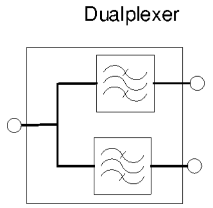

Although it is shown in FIGS. 1 and 2 that the inputs of the power amplifier arrangement 100, 200 for the multiple input signals are separate for each input signal, two or more inputs may be combined to one input. FIG. 4*a* shows an example dual-band power amplifier arrangement 400 with a single input F1+F2 input. The amplifier arrangement 400 comprises a signal splitter 410 configured to split a single input signal within a first and second frequency bands to two input signals with the first frequency band and the second frequency band respectively. The signal splitter 410 may be a combination of a frequency splitter and a filter as shown in FIG. 4*b*, such as a combination of a Wilkinson divider and a filter, as shown in FIG. 4*c*, a combination of a hybrid coupler and a filter, as shown in FIG. 4*d*, or a dualplexer as shown in FIG. 4*e*.

Therefore, according to some embodiments herein, the power amplifier arrangement 100, 200 may further comprise one or more signal splitters configured to split a single input signal to two or more input signals with respective frequency bands.

Figure 5:
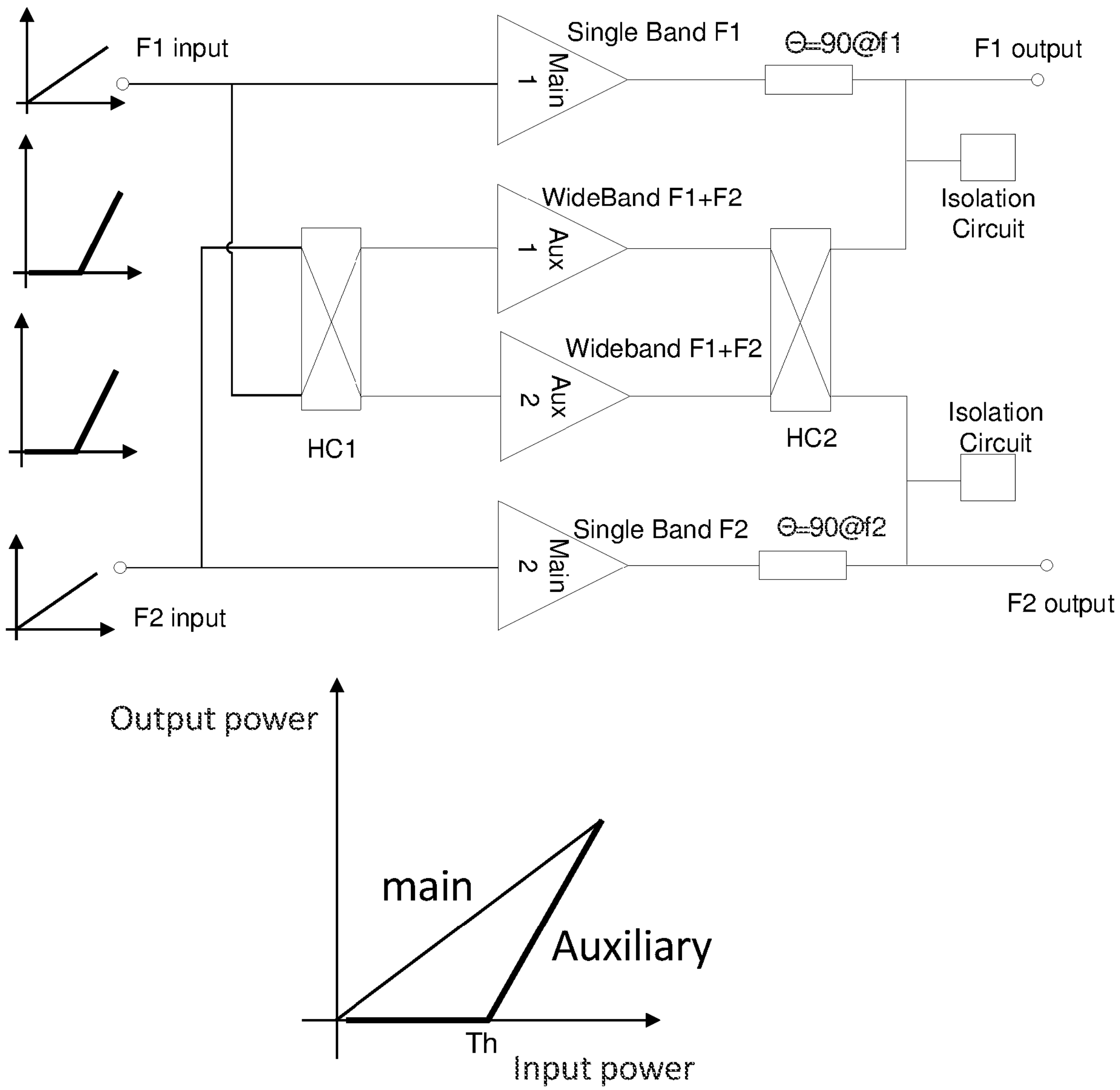
FIG. 5 illustrates examples of split input signals for the main and auxiliary amplifiers according to embodiments herein.
Figure 6:
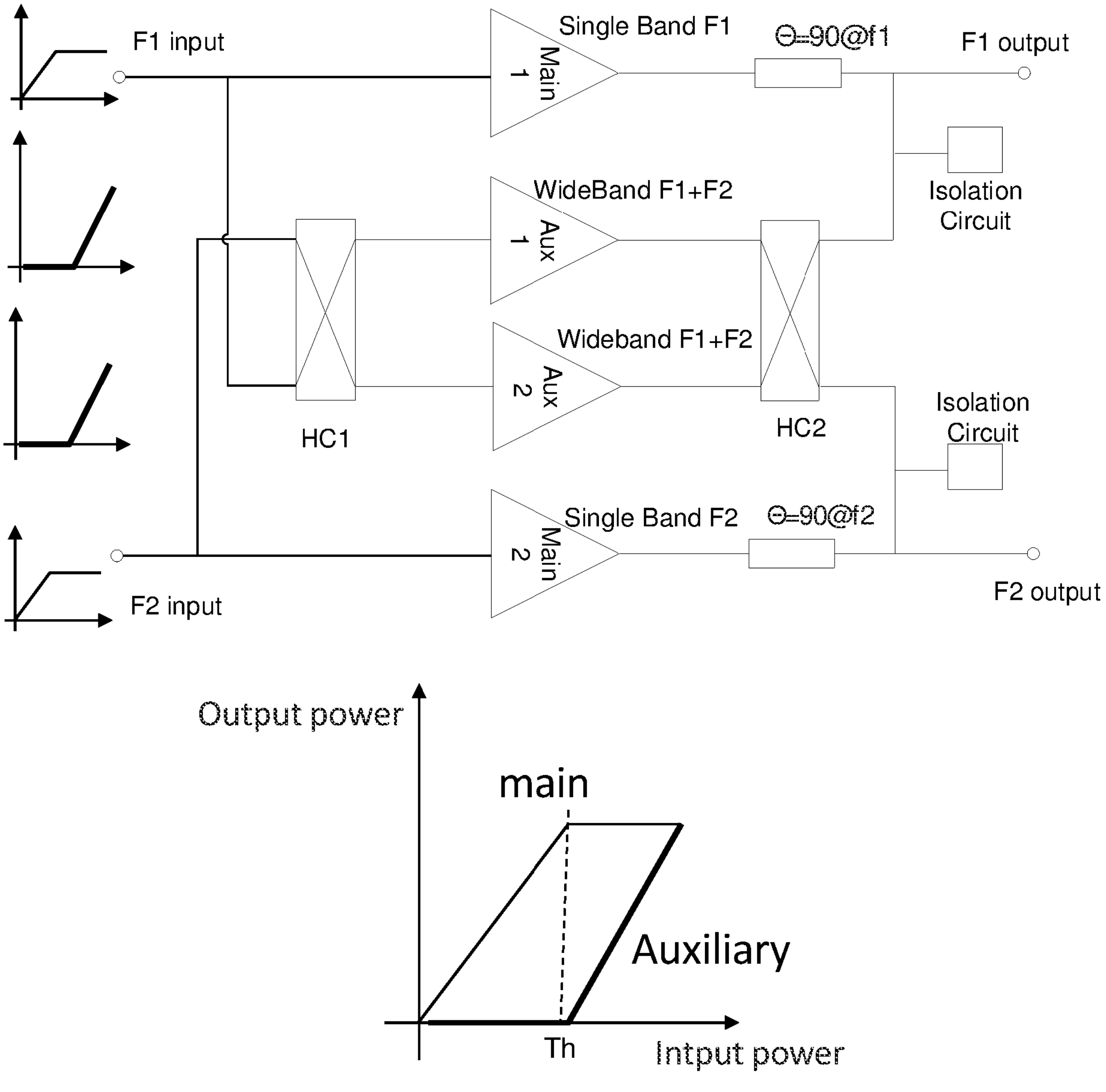
FIG. 6 illustrates other examples of split input signals for the main and auxiliary amplifiers according to embodiments herein.

According to some embodiments herein, in order to control the phase and amplitude of the input signal for the main and auxiliary amplifiers respectively, the input signal may be split to two signals in digital domain, one is for the main amplifiers and the other is for the auxiliary amplifiers. FIGS. 5 and 6 show examples of split input signals for the main and auxiliary amplifiers in digital domain. The input signals within frequency bands F1 and F2 for the first and second main amplifiers may be from one input signal with frequency splitter. The input signals within frequency bands F1 and F2 for the first and second auxiliary amplifiers may be from one input signal with frequency splitter.

In FIGS. 5 and 6, the left tabells shows the output power from digital domain on y-axis versus the input power on x-axis for each of the power amplifiers Main 1, Aux 1, Aux 2, Main 2. The output power from the digital domain finally will be the input power for the power amplifiers. The phase and amplitude of the input signal for the main and auxiliary amplifiers may be controlled in digital domain respectively.

The control purpose is that when the input signal power is below a threshold, shown as Th in FIG. 5, of the auxiliary amplifiers, the auxiliary amplifiers are off, and the signal cannot go through and get amplified by the auxiliary amplifiers. So it is just wasted. Therefore, the output power from the digital domain for inputting to the auxiliary amplifiers is set to zero, i.e. turned off. When the input signal power is above the threshold of the auxiliary amplifiers, the output power from the digital domain for inputting to the auxiliary amplifiers is turned on. The slope of the output power from function block versus the input power function block for the main and auxiliary amplifiers may be changed separately and differently with regard to the original signal.

Therefore, according to some embodiments herein, the input signals for the main and auxiliary amplifiers may be split in digital domain to two signals, one is for inputting to the main amplifiers, and one is for inputting to the auxiliary amplifiers such that the phase and amplitude of the input signal for the main and auxiliary amplifiers may be controlled separately.

Splitting the input signals for the main and auxiliary amplifiers has following advantages:

The phase error between the main and auxiliary amplifiers due to different conditions, e.g. different signal powers or different temperatures may be reduced or compensated.

The input signal amplitude may be controlled for the main and auxiliary amplifiers separately, for example, when the input signal power below a threshold, the input for the auxiliary amplifiers may be turned off.

The input signal power for the main amplifiers may be controlled in order to avoid overdriving the main amplifiers, e.g. when the input signal power is above the saturation threshold of the main amplifiers, the output power from digital domain for inputting to the main amplifiers may be kept the same as when the main amplifier just gets saturated, as shown in FIG. 6, where the saturation is shown by the output power from digital domain reaching a constant value.

Figure 7A:
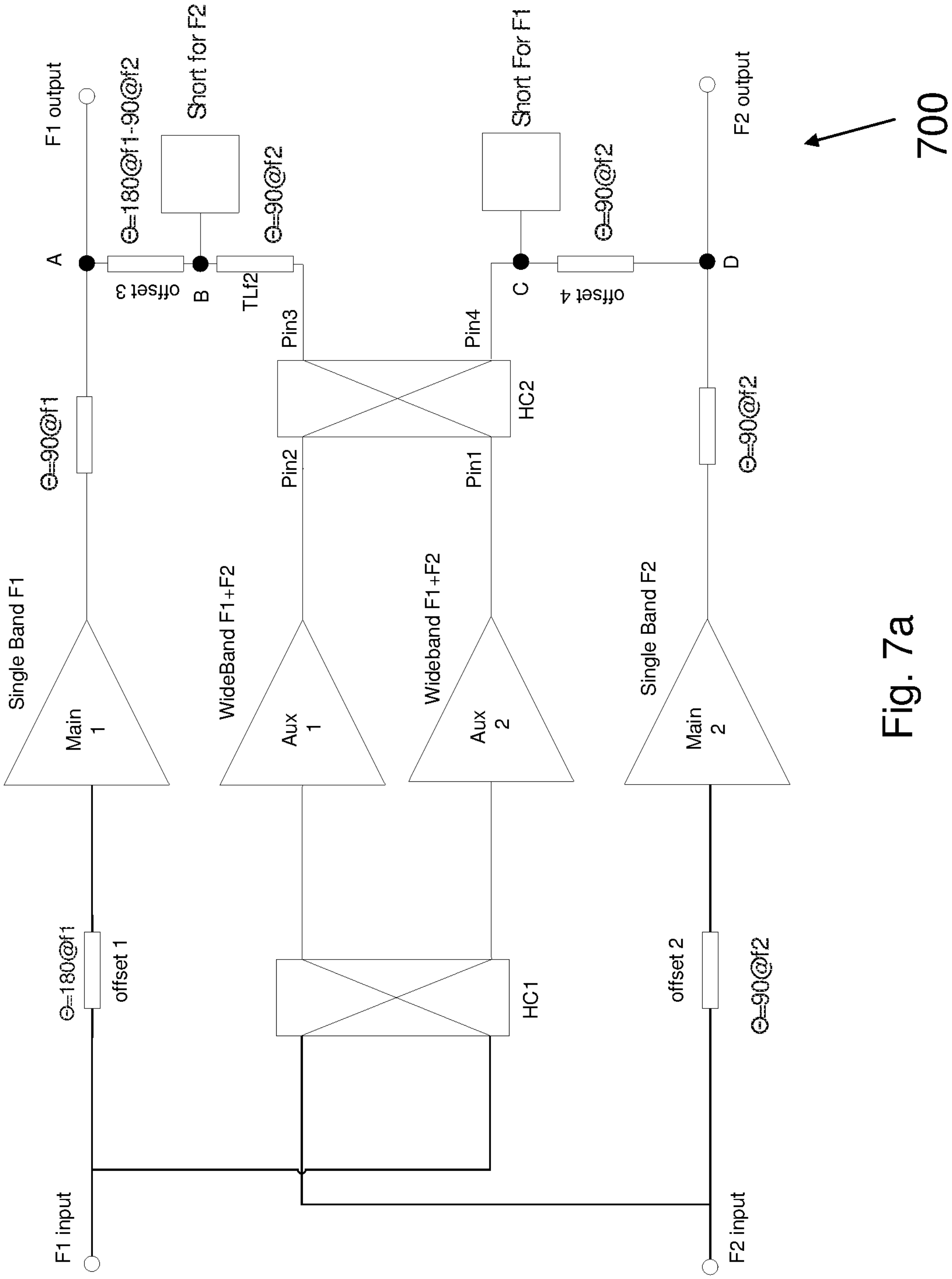
FIG. 7*a* is a principle structure of a power amplifier arrangement to show that the auxiliary amplifiers operate with sub-Doherty function combining.

According to some embodiments herein, the first and second auxiliary amplifiers Aux 1, Aux 2, may have different bias condition for a sub-Doherty operation. FIG. 7*a* shows a principle structure of a power amplifier arrangement 700 for explaining a sub-Doherty function combining.

There are two alternatives:

a) Setting the first auxiliary amplifier Aux 1 input bias in light class C as main amplifier and setting the second auxiliary amplifier Aux 2 input bias in deep class C as auxiliary amplifier for sub-Doherty function.

b) Setting the second auxiliary amplifier Aux 2 input bias in light class C as main amplifier and setting the first auxiliary amplifier Aux 1 input bias in deep class C as auxiliary amplifier for sub-Doherty function.

For example, in Setting a): Aux 1 and Aux 2 are combined as a sub-Doherty function in which Aux 1 plays as "Main amplifier", hereafter referred as "sub-main amplifier", and Aux 2 plays as Auxiliary amplifier, hereafter referred as "sub-auxiliary amplifier".

By light/deep class C mode, it means that two amplifiers are biased in class C, one with a higher bias voltage, i.e. light class C, than another, i.e. deep class C. At lower signal power range, both amplifiers are off due to class C bias. At the medium signal power range, the light class-C biased amplifier is turned on whereas the deep class C biased amplifier is still off.

According to some embodiments herein, one main amplimer e.g. Main 1 or Main 2 and two auxiliary amplifiers Aux 1 and Aux 2 may be combined and work as a three-way Doherty power amplifier. That is if taking the two auxiliary amplifiers working as sub-Doherty function as a combined auxiliary amplifier, then the main amplifier and the combined auxiliary amplifier can combine to a top-level Doherty function.

A three-way Doherty PA consists of 3 branch amplifiers, namely a main amplifier, a first and a second auxiliary amplimers Aux 1, Aux 2. The 3 branch amplifiers cooperate at 3 different signal power ranges. At the low power range, only the main amplifier is working. At the medium power range, the main and Aux 1 are working. At the high power range, all 3 branches are working. As such, the efficiency is enhanced at 3 different power levels.

Sub-Doherty function combining means that the Aux 1 and Aux 2 in a three-way Doherty PA operate like a 2-way Doherty amplifier. That is, they turn on at different signal power levels and interact with each other similar as in a 2-way Doherty PA. They together serve as an auxiliary amplifier, interacting with the main amplifier in the three-way Doherty PA. The operation of the three-way Doherty amplifier and sub-Doherty function combining will be described in the following. To be simplify, taking 50 ohm as normalized impedance for this sub-Doherty function combining.

Step 0

When the input signal is small enough, i.e. below a first threshold, Th1, both Aux 1 and Aux 2 are off, the main amplifier, e.g. Main 1, which is always on for it is biased at class AB or Class B.

Aux 1 and Aux 2 are off. For the output hybrid coupler HC2, Pin2 and Pin1 are open circuit.

For the first signal with the first band F1: Pin4 is short to ground. So the output impedance of Pin3 will be transferred to open circuit for the first signal with the first band F1. Phase offset 3 shown as a transmission line, may be added in order to keep the total phase shifted from Pin3 output to A point, i.e., F1 output, the combining point with the first main amplifier, equal to 180 degrees, or n*180 degrees. That will keep the combined auxiliary amplifier as open circuit at the combining point A.

For the second signal with the second band F2: Pin3 is open circuit, i.e., the ¼ wavelength transmission line TLf2 transfers the short circuit Short for F2, to open circuit. So the Pin4 output impedance is short to ground for the second signal with the second frequency band F2. Phase offset 4 shown as a transmission line, may be added to make the phase shifted with 90 degrees or (2n+1)*90 degrees from Pin4 to the combining point D, i.e., F2 output. That will make the combined auxiliary amplifier as open circuit at the combining point D.

And in this status, both the main amplifier for the first band F1 and the second main amplifier for the second band F2 are working in high efficiency with a 90-degree transmission line impedance transformer T1, T2 respectively.

Step 1

When the input signal power increase from small to large, i.e. above the first threshold, Th1, the first auxiliary amplifier Aux 1, i.e. sub-main amplifier, will be turned on first and the Aux 2, i.e. sub-auxiliary amplifier, is still off.

For F1 band signal, the Aux 1 turns on, Aux 2 is off. For output hybrid coupler HC2, Pin4 is short for F1 band, Pin1 is open when Aux 2 is off. If output Pin3 for F1 band signal is connected with 50 ohm load, the Pin2 output impedance will be transferred to high impedance 100 ohm for F1 band. It's load modulation for Aux 1 to work at high efficiency as a "main amplifier" in the sub-Doherty function for F1 band.

For F2 band signal, for the output hybrid coupler HC2, Pin3 is open for band F2, ¼ wavelength transmission line transfer the short circuit to open. Pin1 is open when Aux 2 is off. If the output port Pin4 is connected to 50 ohm load for F2 band, the Pin2 port impedance will be transferred to high impedance 100 ohm for F2 band. So that it's also load modulation for Aux 1 to work at high efficiency as a "main amplifier" for F2 band in the sub-Doherty function. In this example, Aux 1 is biased higher, i.e. light class C, compared to the Aux 2, so it plays as "main amplifier" for both F1 and F2 band in the sub-Doherty function.

The S parameter matrix for a 3 dB 90° hybrid coupler is described by:

$$[S] = \begin{bmatrix} 0 & 0 & -j\frac{\sqrt{2}}{2} & \frac{\sqrt{2}}{2} \\ 0 & 0 & \frac{\sqrt{2}}{2} & -j\frac{\sqrt{2}}{2} \\ -j\frac{\sqrt{2}}{2} & \frac{\sqrt{2}}{2} & 0 & 0 \\ \frac{\sqrt{2}}{2} & -j\frac{\sqrt{2}}{2} & 0 & 0 \end{bmatrix}$$

The Pin2 load impedance modulation can be got from the S parameter when other 3 ports impedance are fixed.

In this step, for the top-level Doherty function, the power from Aux amplifier starts to inject to combined output with main amplifier. That lead the main amplifier's high load impedance decreased.

Step 2

Then when the signal increases enough, i.e. above a second threshold, Th2, the Aux 2 also will be turned on.

As the input signal power increases, the Aux 1 turns on firstly for it's biased in light class C, then Aux 2 turns on for it's biased in deep class C. The output power injected to the combining point, point A for F1 band, point D for F2 band, is increased. So the load impedance for the main amplifier will be modulated from high impedance to Zopt, an optimum impedance, e.g. 50 ohm. In this case, for sub-Doherty function, both Aux 1 and Aux 2 are turned on, so F1 band signals will be combined in phase at Pin3 of output hybrid coupler HC2 and F2 band signals will be combined in phase at Pin4 of output hybrid coupler HC2 which are same as in the basic architecture.

When the input signal power increases, more power from Aux 2 will be injected to the output port Pin3 of output hybrid coupler HC2 for F1 band and Pin 4 of output hybrid coupler HC2 for F2 band. It will modulate the Pin2 of output hybrid coupler HC2 impedance from 100 ohm to 50 ohm for Aux 1 which is the same as the Doherty function.

The 90&180-degree transmission lines are exemplary in an ideal situation, for the functionality of an impedance inverter. It's well known for people skilled in the art that in practice, due to parasitic effects, transmission lines of other lengths will be used to achieve the impedance inversion function.

Figure 7B:
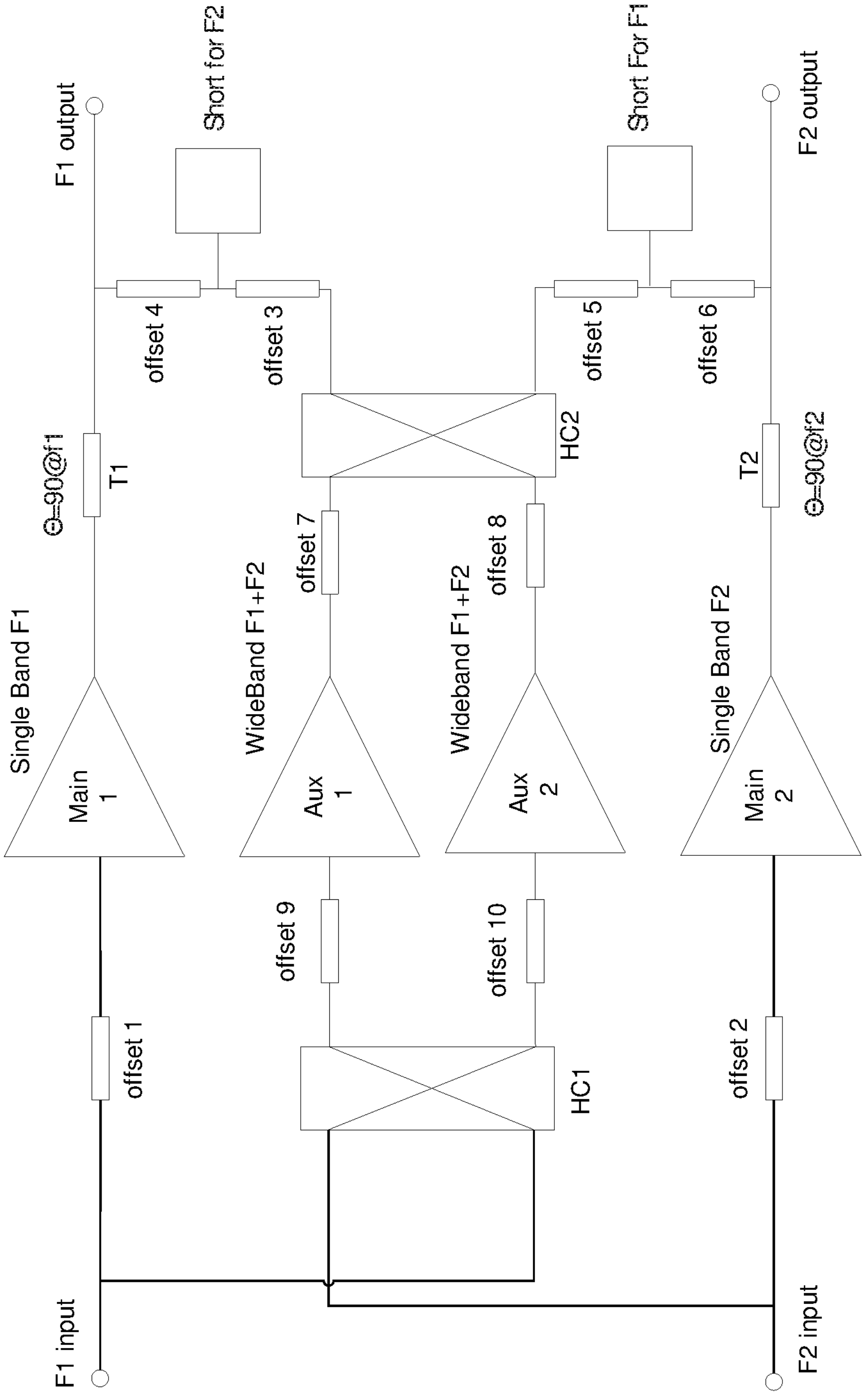
FIG. 7*b* is a general structure of a power amplifier arrangement, where the auxiliary amplifiers may have different bias condition for a sub-Doherty function combining.

Same as FIG. 2*a*, FIG. 7*a* is only a basic principle structure of a dual-band power amplifier. In practical applications, matching networks or phase offset networks are always needed at the input and output of each auxiliary amplifier, between the outputs of a hybrid coupler and the outputs of the power amplifier arrangement, at the input of each main amplifier etc. to compensate the phase differences between the main and auxiliary amplifiers for the input signals to the input hybrid coupler HC1 and the output signals from the output hybrid coupler HC2. FIG. 7*b* shows a general structure of a power amplifier arrangement 700, where Aux 1 and Aux 2 may have different bias condition for a sub-Doherty function combining, and phase offsets 1-10 are added at different locations. If adding a phase offset 7 and offset 8 at the outputs of Aux 1 and Aux 2 respectively, then the phase offset 3, offset 4, offset 5 and offset 6 need to be changed accordingly to achieve the same Doherty function.

Therefore, according to some embodiments herein, the first and second auxiliary amplifiers Aux 1, Aux 2 may be biased differently such that they are turned on at different input signal power level for a sub-Doherty function combining. For example, the first auxiliary amplifier Aux 1 may be configured to operate in light class C mode and the second auxiliary amplifier is configured to operate in deep class C mode, or the first auxiliary amplifier is configured to operate in deep class C mode and the second auxiliary amplifier is configured to operate in light class C mode by setting different biases for the first and second auxiliary amplifiers.

According to some embodiments herein, the power amplifier arrangement 100, 200, 300, 400, 700 may be configured for dynamic time-division-duplex operation. However, during dynamic time-division-duplex operation, for each frequency band, the other transmitting band signal will leakage to the receiver as noise. For example, when the transmitter TX1 is on and the receiver RX2 is on, Main 2 is turned off, but there is still leakage noise from the transmitter TX1 going through to the receiver RX2. Cancellation or isolation of the TX1 leakage from the RX2 is needed.

Figure 8:
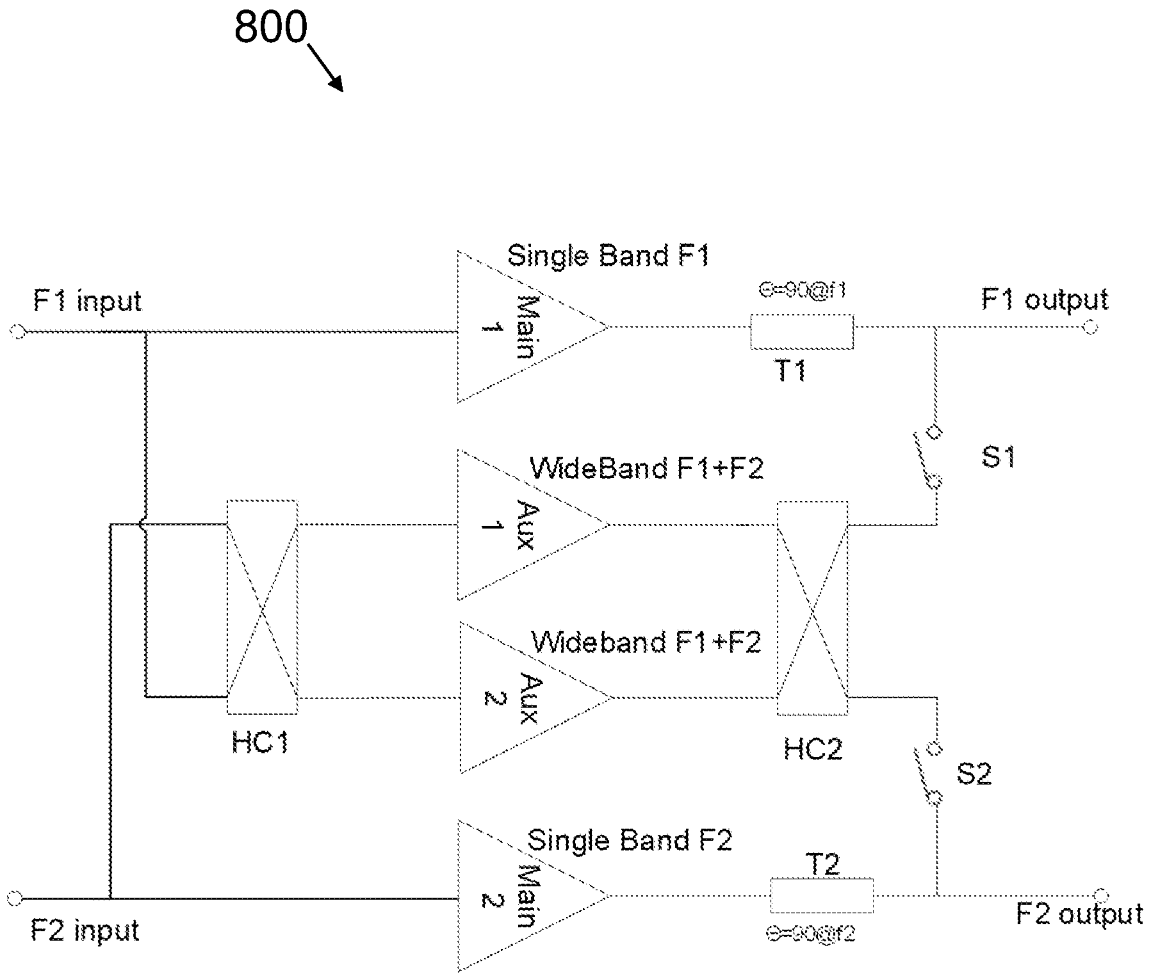
FIG. 8 is a simplified basic structure of a power amplifier arrangement with switches for dynamic TDD application according to embodiments herein.

According to some embodiments herein, a switch may be added to each output of an output hybrid coupler in the power amplifier arrangement 100, 200, 300, 400, 700 to isolate the TX1 leakage from the RX2. Each output of an output hybrid coupler is coupled to an output of the power amplifier arrangement 100, 200, 300, 400, 700 via a switch. FIG. 8 shows an example of dual-band power amplifier arrangement 800 for a dynamic time-division-duplex operation.

The amplifier arrangement 800 comprises a first switch S1 and a second switch S2. The first output of the second hybrid coupler HC2 is coupled to the first output of the power amplifier arrangement 800 F1 output via the first switch S1, the second output of the second hybrid coupler HC2 is coupled to the second output of the power amplifier arrangement F2 output via the second switch S2.

During operation, when a transmitter TX1 for transmitting a signal with the first frequency band F1 is on and a receiver RX2 for receiving a signal with the second frequency band F2 is on, the first main amplifier Main 1 is set on and operating, the second main amplifier Main 2 is set off and not operating, the first switch S1 is turned on and the second switch S2 is turned off. When a transmitter TX2 for transmitting a signal with the second frequency band F2 is on and a receiver RX1 for receiving a signal with the first frequency band F1 is on, the first main amplifier Main 1 is set off and not operating, the second main amplifier Main 2 is set on and operating, the first switch S1 is turned off and the second switch S2 is turned on.

Figure 9:
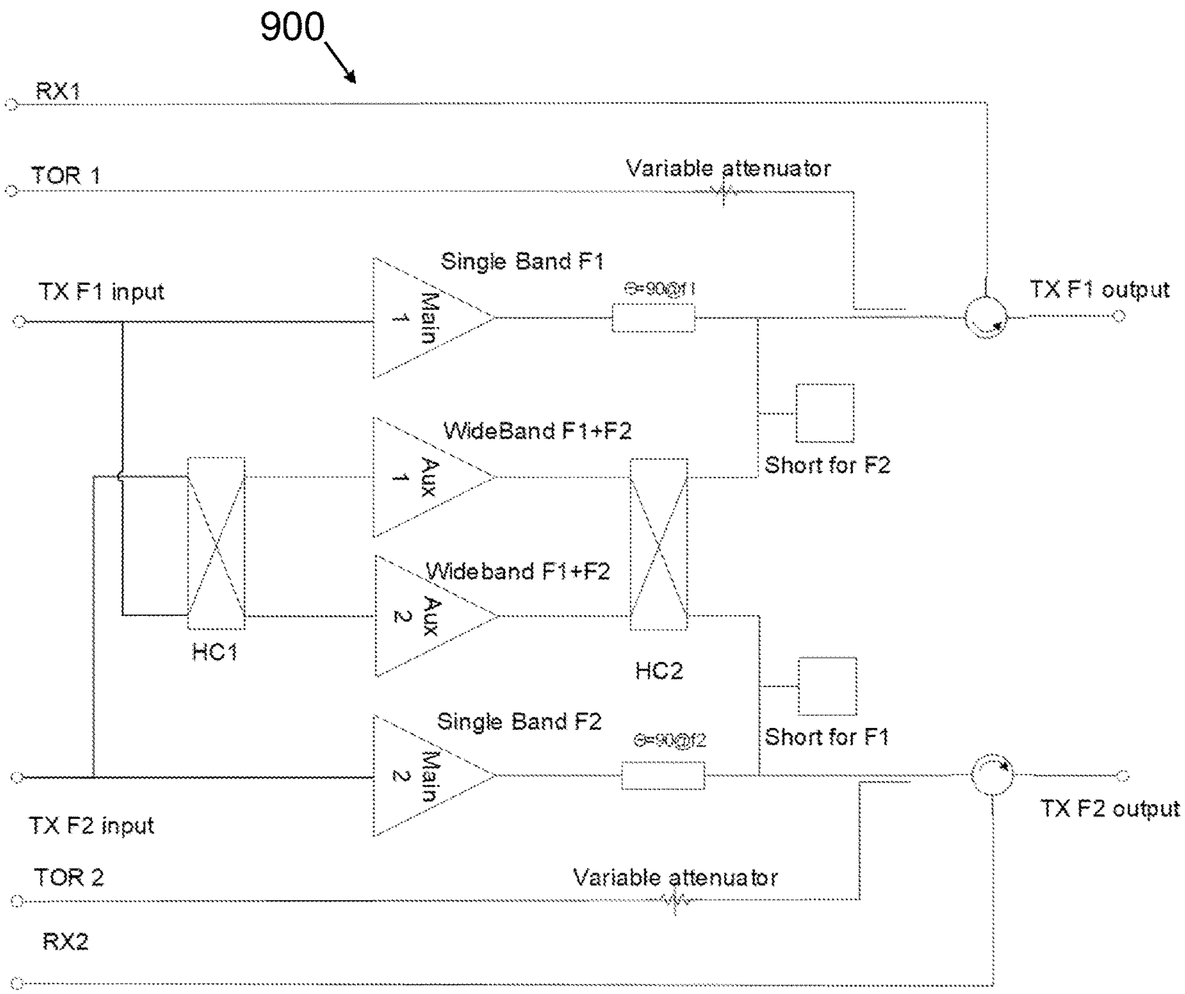
FIG. 9 shows an example implementation of leakage cancellation for dynamic TDD application for the power amplifier arrangement according to embodiments herein.

According to some embodiments herein, leakage cancellation may be implemented in the power amplifier arrangement 100, 200, 300, 400, 700. FIG. 9 shows an example implementation of leakage cancellation for the power amplifier arrangement 100, 200, 300, 400, 700. As shown in FIG. 9, multiple transmitter observation receivers TOR 1, TOR 2 are coupled to each output of the power amplifier arrangement 100, 200, 300, 400, 700 via e.g. a directional coupler to obtain the leakage signal from that output. For example, the leakage signal with the second frequency band, referred as TX1 F2 noise, can be obtained from the TOR 2. Then in digital domain, cancellation of the TX1 F2 noise for RX2 may be done so the remained signal is really the desired receiving signal with the second frequency band F2.

The variable attenuator in TOR transmitter observation receiver can be set in high attenuation when in TX mode because TX power is usually high and set in low attenuation when in RX mode for the noise power is usually low.

The couplings of the hybrid couplers to the auxiliary amplifiers, the inputs and outputs of the power amplifier arrangement 100, 200, 300, 400, 700, 800 and 90/180 degrees transmission lies shown in FIGS. 1, 2, 3, 4, 7, 8 are only exemplary. There are other different alternatives on the couplings of the hybrid couplers as long as at each output of the power amplifier arrangement, after a signal go through the hybrid couplers at the inputs and outputs of the power amplifier arrangement, the amplified signals within a certain frequency band output from the auxiliary amplifiers and main amplifier are combined in-phase at the output for providing the output signal within that frequency band. It is also possible to have more than one hybrid couplers at the inputs and outputs of the power amplifier arrangement 100, 200, 300, 400, 700, 800.

Figure 10:
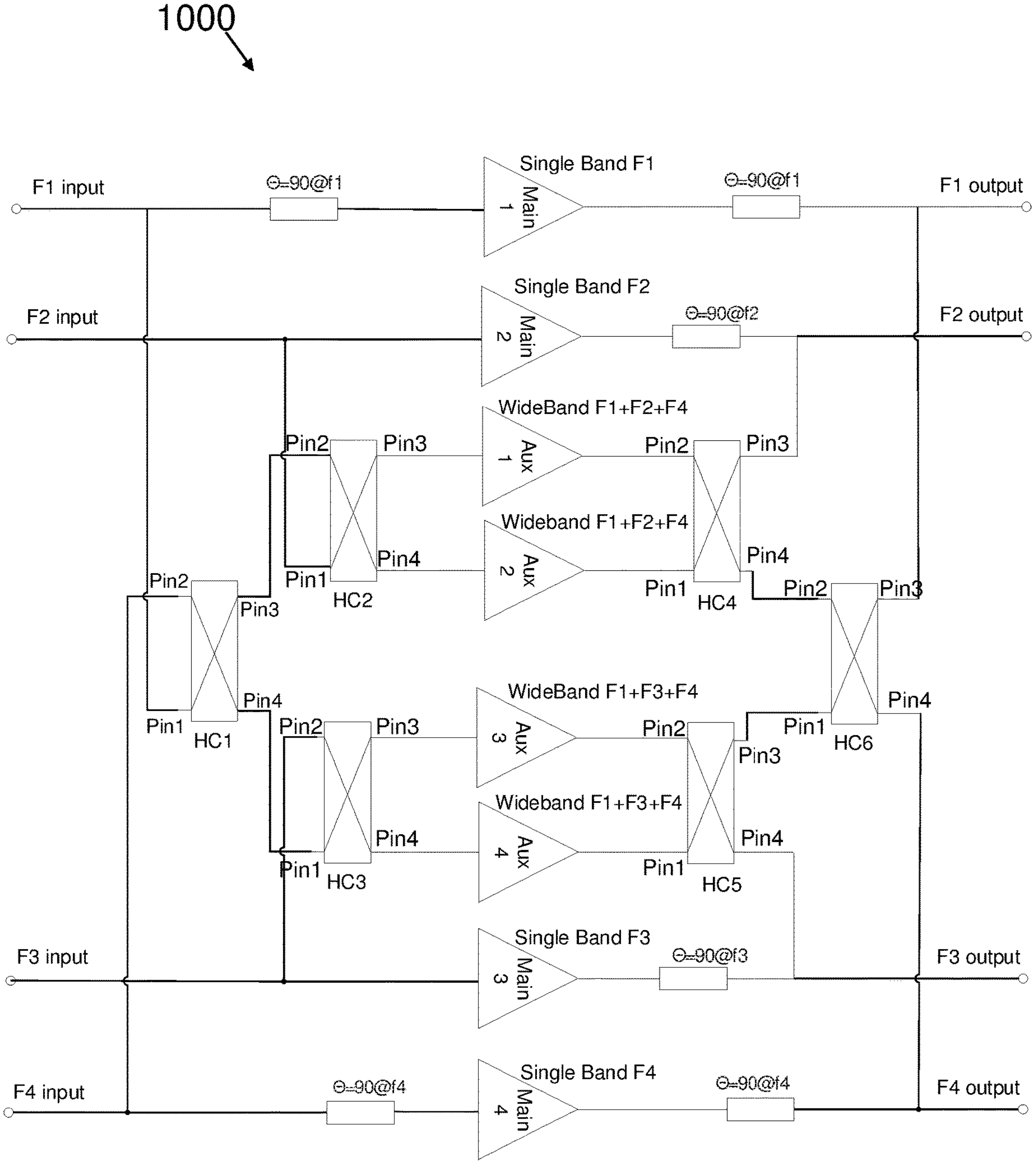
FIG. 10 illustrates an example of 4-band power amplifier arrangement according to embodiments herein.

FIG. 10 shows an example embodiment of a four-band power amplifier arrangement 1000, wherein there are 3 hybrid couplers at the inputs and 3 hybrid couplers at the outputs of the power amplifier arrangement 1000.

The power amplifier arrangement 1000 comprises four inputs F1 input, F2 input, F3 input, F4 input, each input is for receiving an input signal within one frequency band of the four frequency bands F1, F2, F3, F4, and four outputs F1 output, F2 output, F3 output, F4 output, each output is for providing an output signal within one frequency band of the four frequency bands F1, F2, F3, F4.

For example, the first input, F1 input, is for receiving a first input signal within a first frequency band F1, and the first output, F1 output, is for providing a first output signal within the first frequency band F1, etc.

The power amplifier arrangement 1000 further comprises four main amplifiers Main 1, Main 2, Main 3, Main 4 and four auxiliary amplifiers Aux 1, Aux 2, Aux 3, Aux 4.

Inputs of the four main amplifiers are coupled to the respective inputs of the power amplifier arrangement 1000 for receiving the input signals within the respective frequency bands and outputs of the four main amplifiers are coupled to the respective outputs of the power amplifier arrangement 1000 for providing the output signals within the respective frequency bands.

For example, the input of the first main amplifier, Main 1, is coupled to the first input, F1 input, of the power amplifier arrangement 1000 and the output of the first main amplifier, Main 1, is coupled to the first output, F1 output, of the power amplifier arrangement 1000, etc.

Each of the four main amplifiers is configured as a narrow band amplifier for amplifying a signal within one frequency band of the four frequency bands F1, F2, F3, F4. For example, Main 1 is for amplifying a signal within the first frequency band F1, etc.

Each auxiliary amplifier is configured as a wideband amplifier for amplifying signals within at least two frequency bands of the four frequency bands F1, F2, F3, F4.

For example, the first and second auxiliary amplifiers Aux 1, Aux 2, each is configured as a wideband amplifier to amplify the input signals within the first, second and fourth frequency bands F1, F2, F4. The third and fourth auxiliary amplifiers Aux 3, Aux 4, each is configured as a wideband amplifier to amplify the input signals within the first, third and fourth frequency bands F1, F3, F4.

The power amplifier arrangement 1000 further comprises six hybrid couplers HC1, HC2, HC3, HC4, HC5, HC6, 3 hybrid couplers HC1, HC2, HC3 at the inputs and 3 hybrid couplers HC4, HC5, HC6 at the outputs. The terminals of the hybrid couplers are noted with Pin1, Pin2, Pin3 Pin4 and have the same pin configurations as shown in Table 1.

The first and second auxiliary amplifiers Aux 1, Aux 2 are coupled between the second and fourth hybrid couplers HC2, HC4.

The third and fourth auxiliary amplifiers Aux 3, Aux 4 are coupled between the third and fifth hybrid couplers HC3, HC5.

The input of the first auxiliary amplifier Aux 1 is coupled to the second input of the power amplifier arrangement 1000 via the second hybrid coupler HC2.

The input of the second auxiliary amplifier Aux 2 is coupled to the first input of the power amplifier arrangement 1000 via the first and second hybrid couplers HC1, HC2.

The input of the third auxiliary amplifier Aux 3 is coupled to the fourth input of the power amplifier arrangement 1000 via the first and third hybrid couplers HC1, HC3. The input of the fourth auxiliary amplifier Aux 4 is coupled to the third input of the power amplifier arrangement 1000 via the third hybrid coupler HC3.

The hybrid couplers HC1, HC2, HC3 at the inputs of the power amplifier arrangement 1000 are coupled in the following way:

- The first terminal Pin1 of the first hybrid coupler HC1 is coupled to the first input, F1 input, of the amplifier arrangement 1000;
- The second terminal Pin2 of the first hybrid coupler HC1 is coupled to the fourth input, F4 input, of the amplifier arrangement 1000;
- The third terminal Pin3 of the first hybrid coupler HC1 is coupled to the second terminal Pin2 of the second hybrid coupler HC2;
- The fourth terminal Pin4 of the first hybrid coupler HC1 is coupled to the first terminal Pin1 of the second hybrid coupler HC2.

The first terminal Pin1 of the second hybrid coupler HC2 is coupled to the second input, F2 input, of the amplifier arrangement 1000;

The second terminal Pin2 of the second hybrid coupler HC2 is coupled to the third terminal Pin3 of the first hybrid coupler HC1;

The third terminal Pin3 of the second hybrid coupler HC2 is coupled to the input of the first auxiliary amplifiers Aux 1;

The fourth terminal Pin4 of the second hybrid coupler HC2 is coupled to the input of the second auxiliary amplifiers Aux 2.

The first terminal Pin1 of the third hybrid coupler HC3 is coupled to the fourth terminal Pin4 of the first hybrid coupler HC1;

The second terminal Pin2 of the third hybrid coupler HC3 is coupled to the third input, F3 input, of the amplifier arrangement 1000;

The third terminal Pin3 of the third hybrid coupler HC3 is coupled to the input of the third auxiliary amplifiers Aux 3;

The fourth terminal Pin4 of the third hybrid coupler HC3 is coupled to the input of the fourth auxiliary amplifiers Aux 4.

The hybrid couplers HC4, HC5, HC6 at the outputs of the power amplifier arrangement 1100 are coupled in the following way:

The first terminal Pin1 of the fourth hybrid coupler HC4 is coupled to the output of the second auxiliary amplifiers Aux 2;

The second terminal Pin2 of the fourth hybrid coupler HC4 is coupled to the output of the first auxiliary amplifiers Aux 1;

The third terminal Pin3 of the fourth hybrid coupler HC4 is coupled to the second output, F2 output, of the amplifier arrangement 1000;

The fourth terminal Pin4 of the fourth hybrid coupler HC4 is coupled to the second terminal Pin2 of the sixth hybrid coupler HC6.

The first terminal Pin1 of the fifth hybrid coupler HC5 is coupled to the output of the fourth auxiliary amplifiers Aux 4;

The second terminal Pin2 of the fifth hybrid coupler HC5 is coupled to the output of the third auxiliary amplifiers Aux 3;

The third terminal Pin3 of the fifth hybrid coupler HC5 is coupled to the first terminal Pin1 of the sixth hybrid coupler HC6;

The fourth terminal Pin4 of the fifth hybrid coupler HC5 is coupled to the third output, F3 output, of the amplifier arrangement 1000.

The first terminal Pin1 of the sixth hybrid coupler HC6 is coupled to the third terminal Pin3 of the fifth hybrid coupler HC5;

The second terminal Pin2 of the sixth hybrid coupler HC6 is coupled to the fourth terminal Pin4 of the fourth hybrid coupler HC4;

The third terminal Pin3 of the sixth hybrid coupler HC6 is coupled to the first output, F1 output, of the amplifier arrangement 1000;

The fourth terminal Pin4 of the sixth hybrid coupler HC6 is coupled to the fourth output, F4 output, of the amplifier arrangement 1000.

As discussed above, the couplings of the hybrid couplers to the auxiliary amplifiers, the inputs and outputs of the power amplifier arrangement 1000 and 90 degrees transmission lies shown in FIG. 10 are only exemplary. It is possible to have different couplings of the hybrid couplers as long as at each output of the power amplifier arrangement, after a signal go through the hybrid couplers at the inputs and outputs of the power amplifier arrangement, the amplified signals within a certain frequency band output from the auxiliary amplifiers and main amplifier are combined in-phase at the output for providing the output signal within that frequency band.

Figure 11:
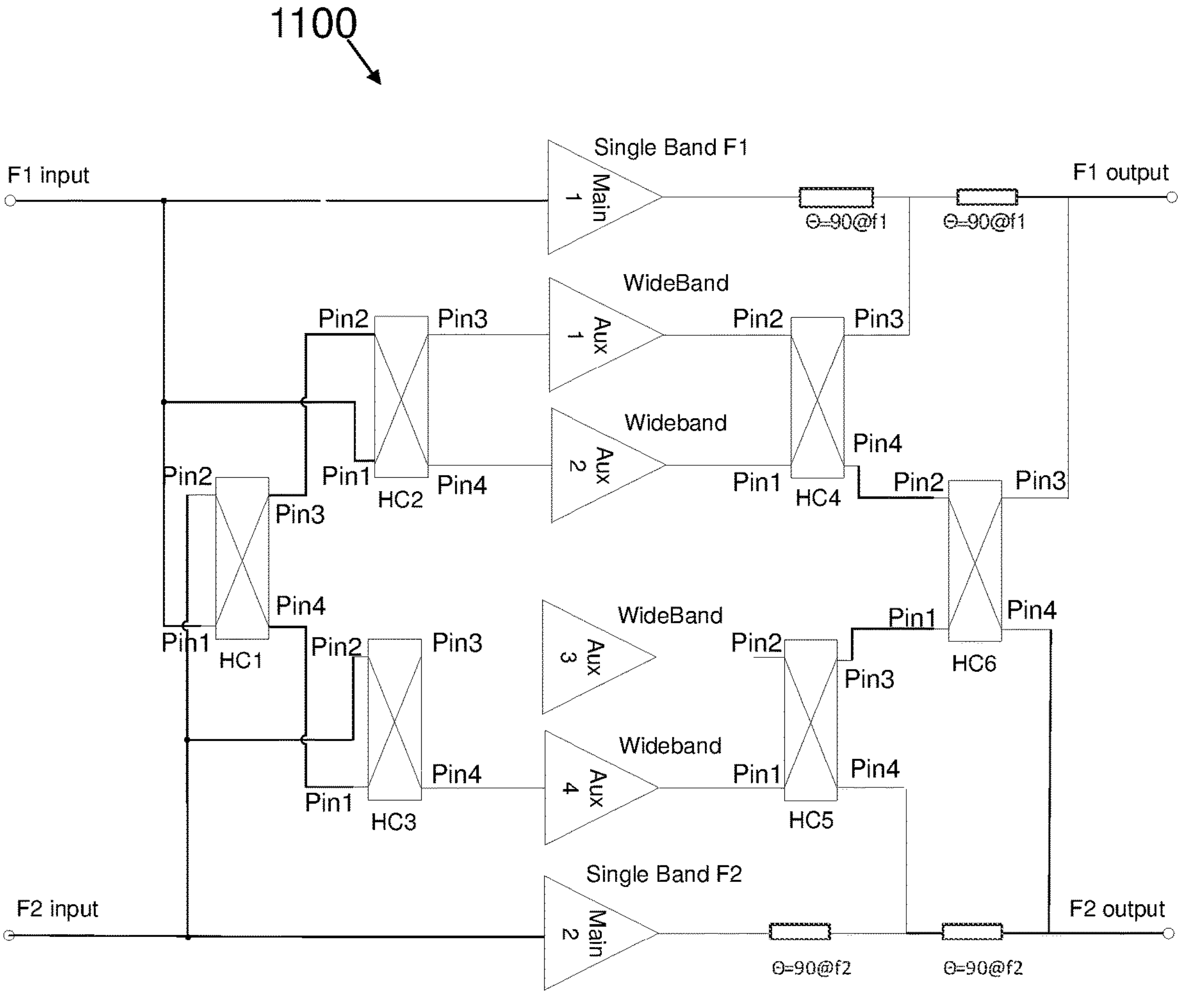
FIG. 11 illustrates an example of dual-band power amplifier arrangement according to embodiments herein.

FIG. 11 shows an example embodiment of a dual-frequency band power amplifier arrangement 1100, wherein there are 3 hybrid couplers at the inputs and 3 hybrid couplers at the outputs of the power amplifier arrangement 1000. The power amplifier arrangement 1100 in FIG. 1100 is a sequential auxiliary architecture for reducing main amplifier load modulation. When the power from the auxiliary amplifier injects into the combining load, the load impedance will be increased for the main amplifier that is named active load modulation. When more power from the auxiliary amplifier injects into the combining load, the load will be increased more for the main amplifier. The high load modulation ratio will impact the matching bandwidth of matching network for the main amplifier. The load modulation ratio is the ratio of the load impedance after the load modulation to the load impedance before the load modulation.

In this architecture, the output from the auxiliary amplifier is split to two combining point. So the load modulate will be sequential, i.e. step by step, for the main amplifier. It will extend the bandwidth of matching network for the main amplifier.

The power amplifier arrangement 1100 comprises two inputs F1 input, F2 input, each input is for receiving an input signal within one frequency band of the two frequency bands F1, F2, and two outputs F1 output, F2 output, each output is for providing an output signal within one frequency band of the two frequency bands F1, F2.

For example, the first input, F1 input, is for receiving a first input signal within a first frequency band F1, and the first output, F1 output, is for providing a first output signal within the first frequency band F1, etc.

The power amplifier arrangement 1100 further comprises two main amplifiers Main 1, Main 2 and four auxiliary amplifiers Aux 1, Aux 2, Aux 3, Aux 4.

Inputs of the two main amplifiers are coupled to the respective inputs of the power amplifier arrangement 1100 for receiving the input signals within the respective frequency bands and outputs of the two main amplifiers are coupled to the respective outputs of the power amplifier arrangement 1100 for providing the output signals within the respective frequency bands.

For example, the input of the first main amplifier, Main 1, is coupled to the first input, F1 input, of the power amplifier arrangement 1100 and the output of the first main amplifier, Main 1, is coupled to the first output, F1 output, of the power amplifier arrangement 1100, etc.

Each of the two main amplifiers is configured as a narrow band amplifier for amplifying a signal within one frequency band of the two frequency bands F1, F2. For example, Main 1 is for amplifying a signal within the first frequency band F1, etc.

Each auxiliary amplifier is configured as a wideband amplifier for amplifying signals within the two frequency bands F1, F2.

The power amplifier arrangement 1100 further comprises six hybrid couplers HC1, HC2, HC3, HC4, HC5, HC6, 3 hybrid couplers HC1, HC2, HC3 at the inputs and 3 hybrid couplers HC4, HC5, HC6 at the outputs. The terminals of the hybrid couplers are noted with Pin1, Pin2, Pin3 Pin4 and has the same pin configurations as shown in Table 1.

The first and second auxiliary amplifiers Aux 1, Aux 2 are coupled between the second and fourth hybrid couplers HC2, HC4.

The third and fourth auxiliary amplifiers Aux 3, Aux 4 are coupled between the third and fifth hybrid couplers HC3, HC5.

The input of the first auxiliary amplifier Aux 1 is coupled to the first input of the power amplifier arrangement 1100 via the second hybrid coupler HC2.

The input of the second auxiliary amplifier Aux 2 is coupled to the first input of the power amplifier arrangement 1100 via the first and second hybrid couplers HC1, HC2.

The input of the third auxiliary amplifier Aux 3 is coupled to the second input of the power amplifier arrangement 1100 via the first and third hybrid couplers HC1, HC3.

The input of the fourth auxiliary amplifier Aux 4 is coupled to the second input of the power amplifier arrangement 1100 via the third hybrid coupler HC3. The hybrid couplers HC1, HC2, HC3 at the inputs of the power amplifier arrangement 1100 are coupled in the following way:

The first terminal Pin1 of the first hybrid coupler HC1 is coupled to the first input, F1 input, of the amplifier arrangement 1100;

The second terminal Pin2 of the first hybrid coupler HC1 is coupled to the second input, F2 input, of the amplifier arrangement 1100;

The third terminal Pin3 of the first hybrid coupler HC1 is coupled to the second terminal Pin2 of the second hybrid coupler HC2;

The fourth terminal Pin4 of the first hybrid coupler HC1 is coupled to the first terminal Pin1 of the second hybrid coupler HC2.

The first terminal Pin1 of the second hybrid coupler HC2 is coupled to the first input, F1 input, of the amplifier arrangement 1100;

The second terminal Pin2 of the second hybrid coupler HC2 is coupled to the third terminal Pin3 of the first hybrid coupler HC1;

The third terminal Pin3 of the second hybrid coupler HC2 is coupled to the input of the first auxiliary amplifiers Aux 1;

The fourth terminal Pin4 of the second hybrid coupler HC2 is coupled to the input of the second auxiliary amplifiers Aux 2.

The first terminal Pin1 of the third hybrid coupler HC3 is coupled to the fourth terminal Pin4 of the first hybrid coupler HC1;

The second terminal Pin2 of the third hybrid coupler HC3 is coupled to the second input, F2 input, of the amplifier arrangement 1100;

The third terminal Pin3 of the third hybrid coupler HC3 is coupled to the input of the third auxiliary amplifiers Aux 3;

The fourth terminal Pin4 of the third hybrid coupler HC3 is coupled to the input of the fourth auxiliary amplifiers Aux 4.

The hybrid couplers HC4, HC5, HC6 at the outputs of the power amplifier arrangement 1100 are coupled in the following way:

The first terminal Pin1 of the fourth hybrid coupler HC4 is coupled to the output of the second auxiliary amplifiers Aux 2;

The second terminal Pin2 of the fourth hybrid coupler HC4 is coupled to the output of the first auxiliary amplifiers Aux 1;

The third terminal Pin3 of the fourth hybrid coupler HC4 is coupled to the first output, F1 output, of the amplifier arrangement 1100 via a transmission line;

The fourth terminal Pin4 of the fourth hybrid coupler HC4 is coupled to the second terminal Pin2 of the sixth hybrid coupler HC6.

The first terminal Pin1 of the fifth hybrid coupler HC5 is coupled to the output of the fourth auxiliary amplifiers Aux 4;

The second terminal Pin2 of the fifth hybrid coupler HC5 is coupled to the output of the third auxiliary amplifiers Aux 3;

The third terminal Pin3 of the fifth hybrid coupler HC5 is coupled to the first terminal Pin1 of the sixth hybrid coupler HC6;

The fourth terminal Pin4 of the fifth hybrid coupler HC5 is coupled to the second output, F2 output, of the amplifier arrangement 1100 via a transmission line.

The first terminal Pin1 of the sixth hybrid coupler HC6 is coupled to the third terminal Pin3 of the fifth hybrid coupler HC5;

The second terminal Pin2 of the sixth hybrid coupler HC6 is coupled to the fourth terminal Pin4 of the fourth hybrid coupler HC4;

The third terminal Pin3 of the sixth hybrid coupler HC6 is coupled to the first output, F1 output, of the amplifier arrangement 1100;

The fourth terminal Pin4 of the sixth hybrid coupler HC6 is coupled to the second output, F2 output, of the amplifier arrangement 1100.

As discussed above, the couplings of the hybrid couplers to the auxiliary amplifiers, the inputs and outputs of the power amplifier arrangement 1100, and 90-degrees transmission lies shown in FIG. 1100 are only exemplary. It is possible to have different couplings of the hybrid couplers as long as at each output of the power amplifier arrangement, after a signal go through the hybrid couplers at the inputs and outputs of the power amplifier arrangement, the amplified signals within a certain frequency band output from the auxiliary amplifiers and main amplifier are combined in-phase at the output for providing the output signal within that frequency band.

According to some embodiments herein, two or more of the dual-frequency band power amplifier arrangements 1100, or two or more of the four-frequency band power amplifier arrangement 1000, or a combination of the four-frequency band and dual-frequency band power amplifier arrangements 1000, 1100, or any combination of the power amplifier arrangements 200, 300, 400, 700, 800, 1000, 1100 may form a multiband power amplifier arrangement.

Figure 12:
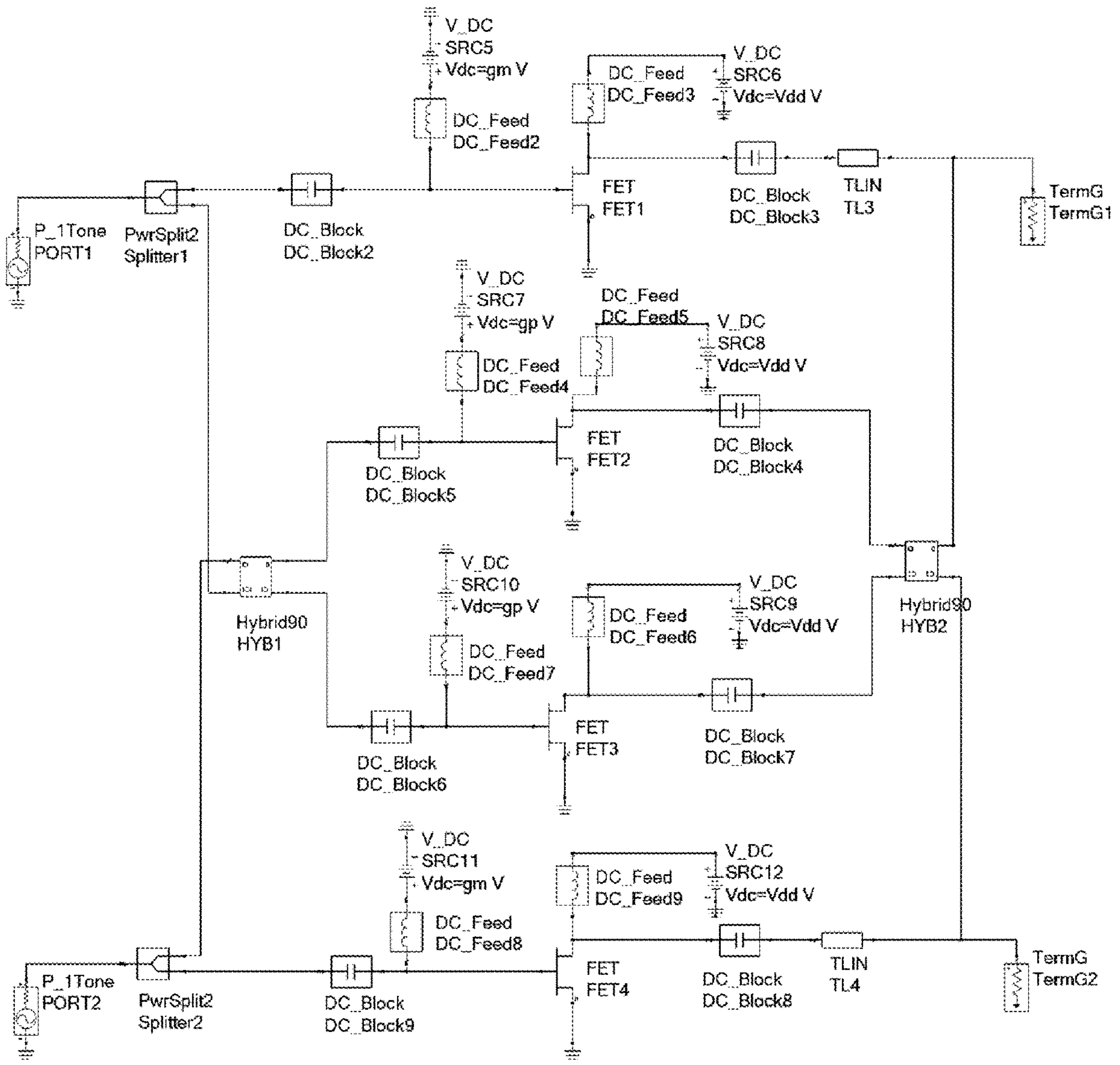
FIG. 12 illustrates a simulation circuit for the power amplifier arrangement according to embodiments herein.

To illustrate the performance of the power amplifier arrangement 100, 200, 300, 400, 700, 800, 1000, 1100, simulations have been done for different applications. FIG. 12 shows an example simulation circuit, where power amplifiers are shown as field-effect transistors (FET).

An ideal FET model with output drain current $I_{ds}$ shown as below is used for simulation:

$$I_{ds}=\frac{\beta(V_{gs}-V_{th})^2}{1+b(V_{gs}-V_{th})}*(1+\lambda*V_{ds})*\tanh(\alpha*V_{ds}).$$

Figure 13:
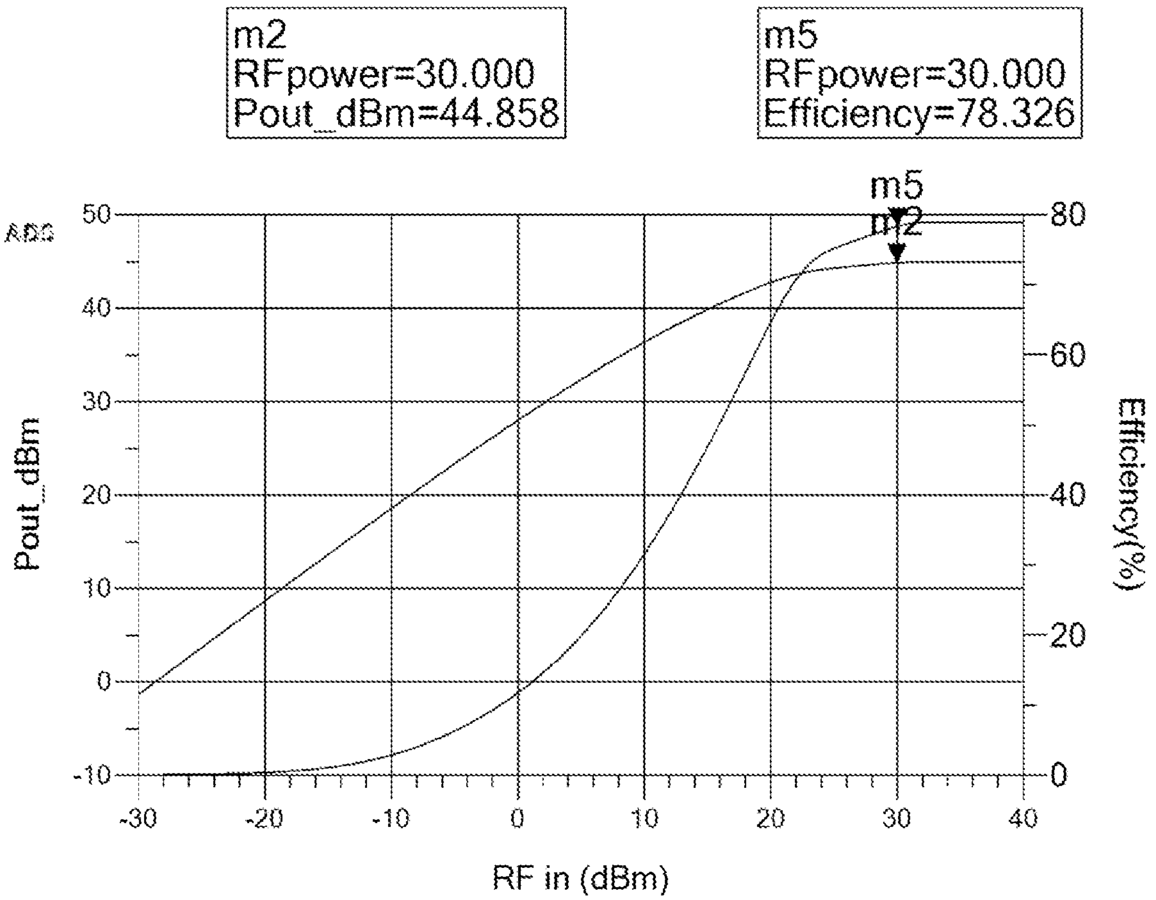
FIG. 13 is a diagram illustrating simulation results for an ideal FET power amplifier.

Setting e.g. β=0.08, b=0.3, λ=0.03, α=1.3, $I_{max}$=2A is the maximum drain current of $I_{ds}$, and the direct current (DC) bias voltage at the drain to Vdd=50V. So, the peak output power is about 44 dBm and efficiency is around 78% with 50 ohm load and 30 dBm input power, when a power amplifier with a FET is biased at class B mode. The simulation results for the power amplifier with a FET are shown in FIG. 13.

The output impedance is open when the power amplifier with a FET is biased in class C mode, but when it's biased in class AB mode the output impedance is decreased that's because of the parameter λ which is related to the drain conductance.

The same FET model is used for 2 narrow band main amplifiers which are biased at class AB mode and 2 wideband auxiliary amplifiers which are biased at class C mode to form, for example, a symmetric dual band Doherty power amplifier.

The hybrid coupler is used as an input power divider and output power combiner for the 2 auxiliary amplifiers. As shown in FIG. 12, the simulation circuit is based on the basic structure for the dual band power amplifier arrangement 200 shown in FIG. 2, which have 2 input ports and 2 output ports. The upper ports are for F1 frequency band and the lower ports are for F2 frequency band. 3 typical application cases are simulated.

Case 1: input power ratio for F1 and F2 is F1:F2=1:0

Figure 14:
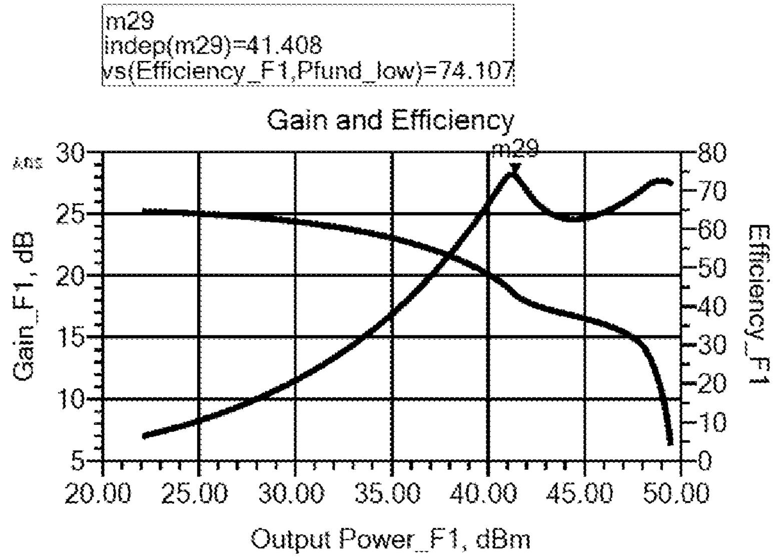
FIGS. 14-19 are simulation results for the power amplifier arrangement according to embodiments herein.

In this case, only signal with band F1 has power. The two auxiliary amplifiers are occupied by band F1. Peak output power is about 49.6 dBm. The power backoff efficiency is around 74% at output power 41.5 dBm. The simulation results are shown in FIG. 14.

Case 2: Input power ratio for F1 and F2 is F1:F2=1:1

Figure 15:
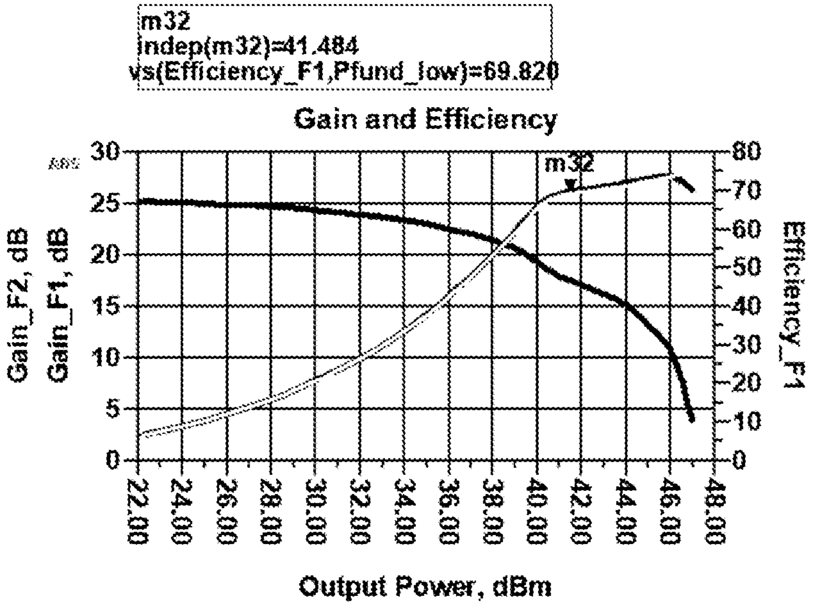

In this case, the input signal power is same for band F1 and band F2. The auxiliary amplifiers are shared for each band with the same power. The output power and performance are the same for both bands, and the peak power of each band is about 47 dBm. The power backoff efficiency is around 69.8% at output power 41.5 dBm. The simulation results are shown in FIG. 15.

Case 3: Input power ratio for F1 and F2 is F1:F2=1:0.25

Figure 16:
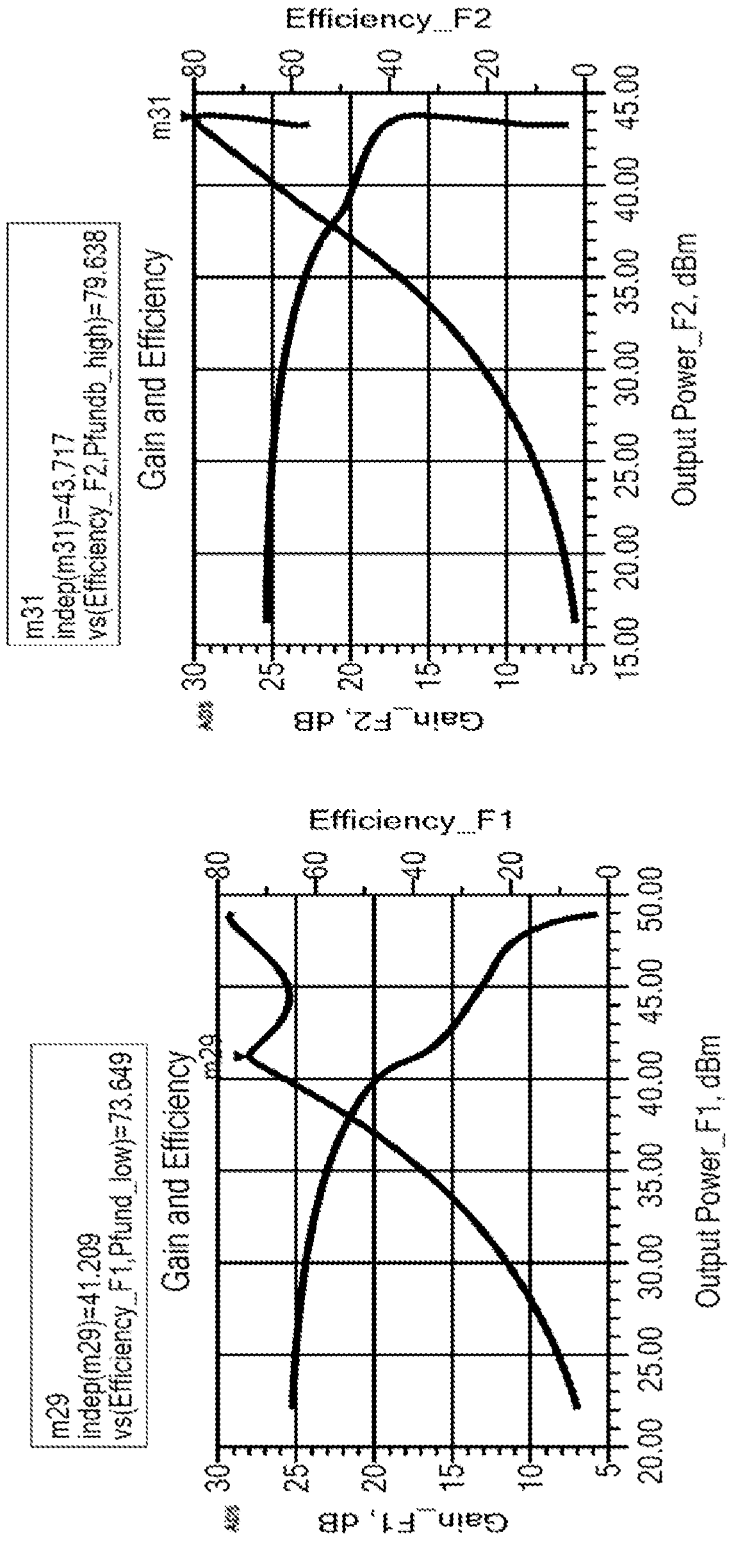

In this case, the input signal power for band F1 is 4 times of the band F2, the auxiliary amplifiers are almost occupied by band F1 signal. Band F2 signal is mainly amplified by the main amplifier for band F2. The peak power for band F1 is about 49 dBm and the peak power for band F2 is about 44 dBm. The efficiency is around 73.6% at power backoff to 41.2 dBm for band F1, around 79.6% at output power 43.7 dBm for band F2. The simulation results are shown in FIG. 16.

If isolation circuits are added at the auxiliary amplifier output, higher efficiency performance can be achieved. The isolation circuit added at the output of the first auxiliary amplifier is short to ground for F2 band signal. The isolation circuit added at the output of the second auxiliary amplifier is short circuit for F1 band signal.

Figure 17:
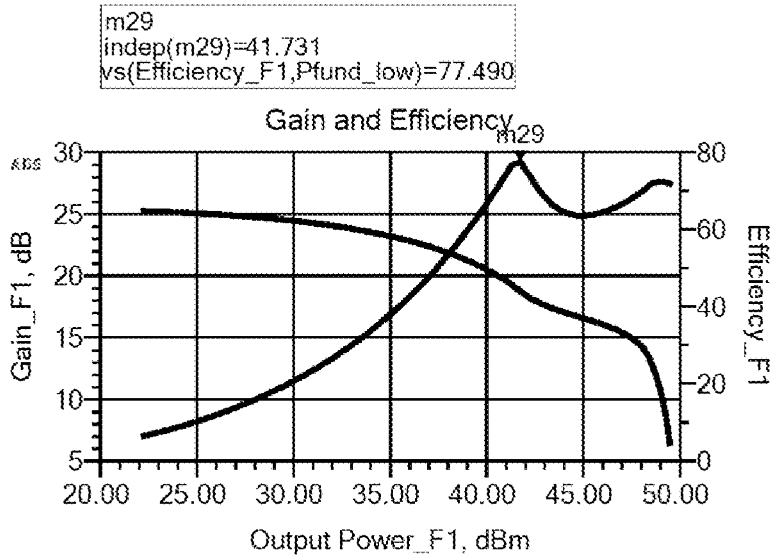

Simulation performance for case 1, case 2 and case 3 described above is shown as the following:

Case 1: Efficiency 77.5%, at 41.7 dBm output power. The simulation results are shown in FIG. 17.

Figure 18:
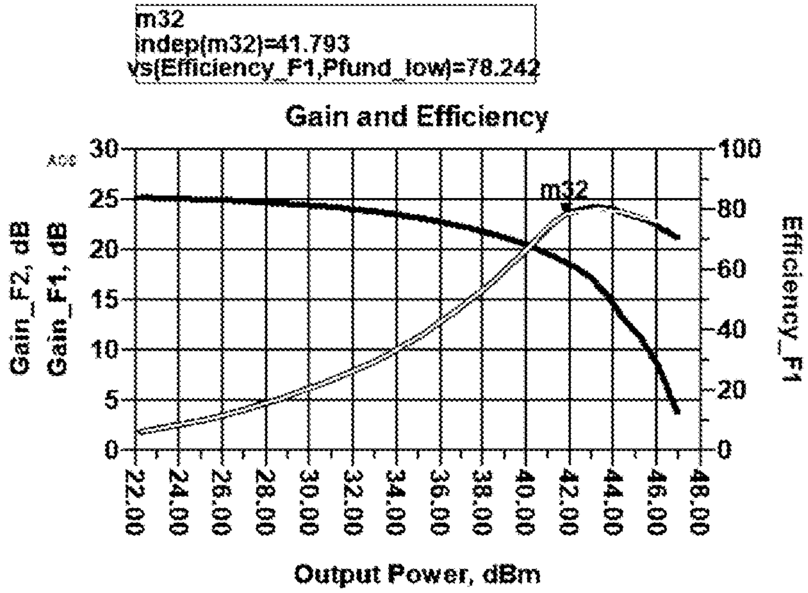

Case 2: Efficiency 78.2%, at 41.7 dBm output power. The simulation results are shown in FIG. 18.

Figure 19:
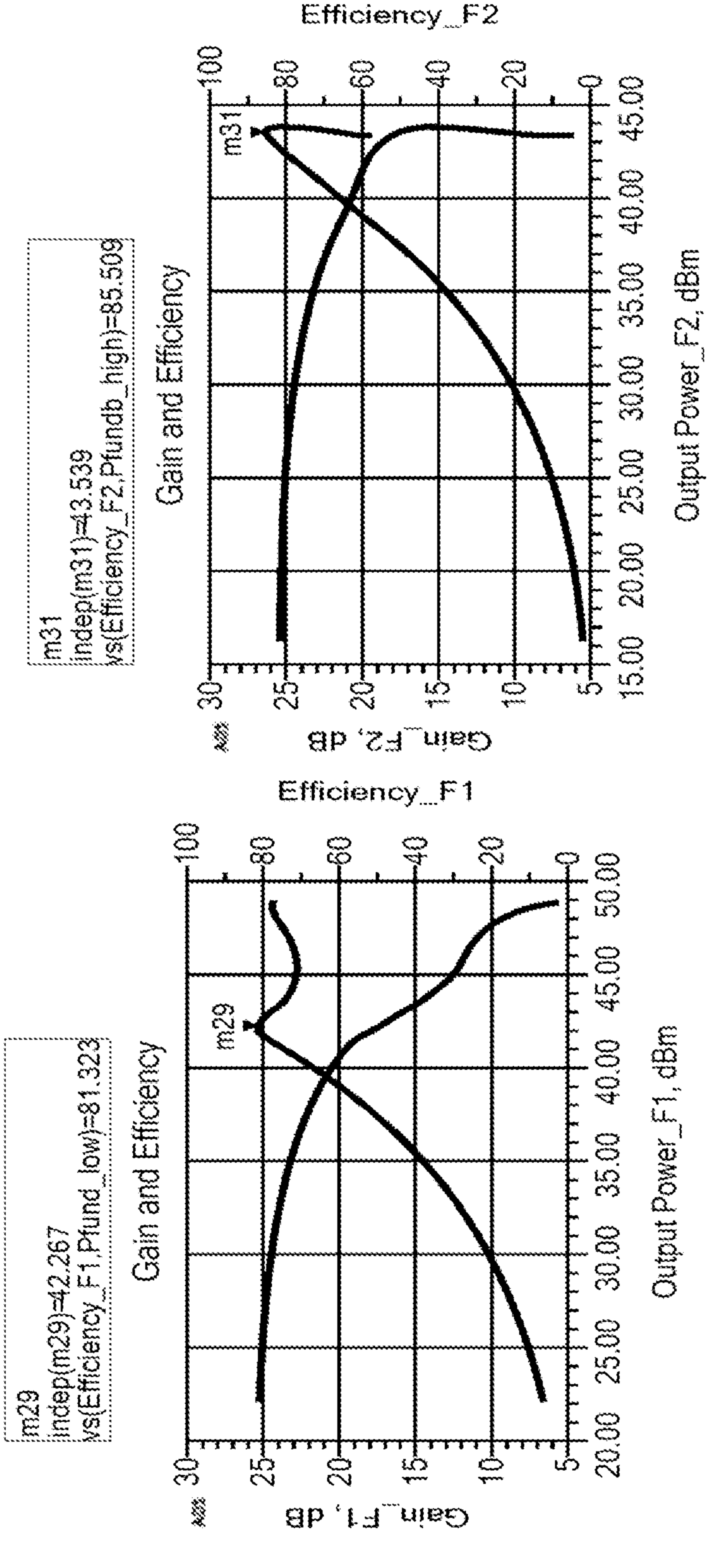

Case 3: Efficiency 81.3%, at 42.2 dBm output power for F1 Band, Efficiency 85.5%, at 43.5 dBm output power. The simulation results are shown in FIG. 19.

As can be seen, the efficiency for each of the three application cases is higher than the original circuit without the isolation circuits.

Therefore, the power amplifier arrangement 100, 200, 300, 400, 700, 800, 1000, 1100 according to embodiments herein can achieve a multiband DPA performance with high efficiency with power pooling function as described above by the combined main and auxiliary amplifiers.

To summarize, in the power amplifier arrangement 100, 200, 300, 400, 700, 800, 1000, 1100 according to embodiments herein, for each output port, the narrow band main amplifier works at high efficiency status as a conventional narrow band DPAs, the wideband auxiliary amplifiers are sharing for different band signals which can support multi-band power pooling application. With 3 dB 90-degree hybrid couplers, it's easy to divide the different band signal power for different band outputs. The power amplifier arrangement 100, 200, 300, 400, 700, 800, 1000, 1100 according to embodiments herein has N narrow-band outputs. The signal power from the N narrow-band main amplifiers and the wideband auxiliary amplifiers are combined at N different combining points, in contrast to the single power combining point in prior art solution. Thus, there is no need of a 1-to-N multiplexer at the PA output to feed N narrow-band filters, the insertion loss, volume, and weight of the radio units are thereby reduced.

The embodiments herein may be applied to multiway Doherty, symmetric Doherty, asymmetric Doherty, inverted Doherty and multistage Doherty power amplifiers.

Figure 20:
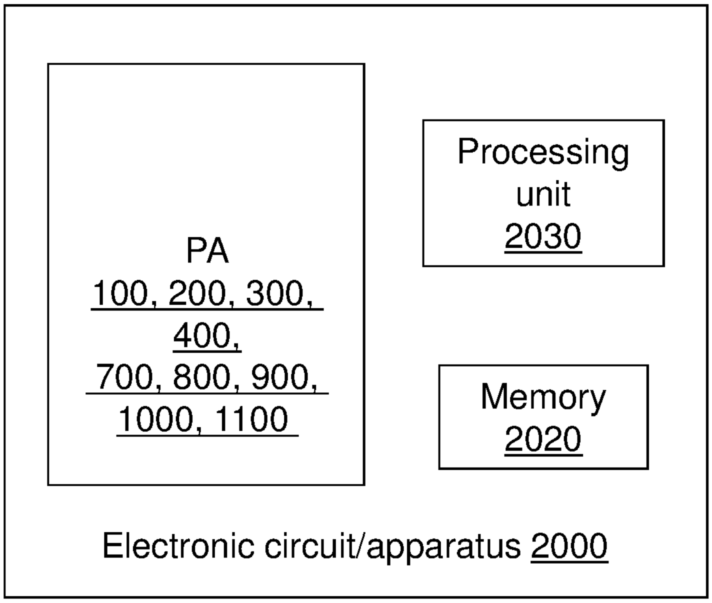
FIG. 20 is a block diagram illustrating an electronic circuit or apparatus in which the power amplifier arrangement according to embodiments herein may be implemented.

The power amplifier arrangement 100, 200, 300, 400, 700, 800, 1000, 1100 according to embodiments herein may be employed in various electronic circuits or apparatuses. FIG. 20 shows a block diagram for an electronic circuit or apparatus 2000. The electronic circuit or apparatus 2000 comprises a power amplifier arrangement PA 100, 200, 300, 400, 700, 800, 1000, 1100 according to the embodiments herein. The electronic circuit or apparatus 2000 may be a transmitter or a transceiver in a cellular communications system/network. The electronic apparatus 2000 may comprise other units, where a memory 2020, a processing unit 2030 are shown. The electronic apparatus 2000 may be a user equipment or a mobile device, a wireless communication device, a radio base station for a cellular communication system.

Those skilled in the art will understand that the power amplifier arrangement 100, 200, 300, 400, 700, 800, 1000, 1100 according to embodiments herein may be implemented by any semiconductor technology.

When using the word "comprise" or "comprising" it shall be interpreted as non-limiting, i.e. meaning "consist at least of".

The embodiments herein are not limited to the above described embodiments. Various alternatives, modifications and equivalents may be used. Therefore, the above embodiments should not be taken as limiting the scope of the embodiments herein, which is defined by the appended claims.

The invention claimed is:

1. A power amplifier arrangement for amplifying signals with multiple frequency bands wherein the power amplifier arrangement comprises:

multiple inputs, wherein each input is for receiving an input signal within one frequency band of the multiple frequency bands;

multiple outputs, wherein each output is for providing an output signal within one frequency band of the multiple frequency bands;

multiple main amplifiers, wherein each of the multiple main amplifiers is configured as a narrow band amplifier for amplifying a signal within one frequency band of the multiple frequency bands, and wherein inputs of the multiple main amplifiers are coupled to the respective inputs of the power amplifier arrangement for receiving the input signals within the respective frequency bands and outputs of the multiple main amplifiers are coupled to the respective outputs of the power amplifier arrangement for providing the output signals within the respective frequency bands;

multiple auxiliary amplifiers, wherein each auxiliary amplifier is configured as a wideband amplifier for amplifying signals within at least two frequency bands of the multiple frequency bands;

one or more input hybrid couplers at the inputs of the power amplifier arrangement; and one or more output hybrid couplers at the outputs of the power amplifier arrangement; and wherein an input of an auxiliary amplifier is coupled to one of the multiple inputs of the power amplifier arrangement through one or more input hybrid couplers to receive the input signals within at least two frequency bands; and an output of an auxiliary amplifier is coupled to one of the multiple outputs of the power amplifier arrangement through one or more output hybrid couplers such that an output signal from that auxiliary amplifier is split into different output signals within different frequency bands, and the signals within the same frequency band output from the main amplifier and auxiliary amplifiers are combined in-phase at the output of the power amplifier arrangement for providing the output signal within that frequency band.

2. The power amplifier arrangement according to claim 1, wherein each of the multiple main amplifiers is configured to amplify an input signal with a full power range, and each of the multiple auxiliary amplifiers is configured to amplify the input signal with a power range above a threshold.

3. The power amplifier arrangement according to claim 1, further comprising multiple isolation circuits coupled to the respective outputs of the power amplifier arrangement, wherein each isolation circuit is configured to resonance at a certain frequency to filter out the signal with this frequency from the output of the power amplifier arrangement.

4. The power amplifier arrangement according to claim 1, further comprising one or more signal splitters configured to split a single input signal to two or more input signals with respective frequency bands.

5. The power amplifier arrangement according to claim 4, wherein the signal splitter comprises any one of a dualplexer, a combination of a Wilkinson divider and a filter, and a combination of a hybrid coupler and a filter.

6. The power amplifier arrangement according to claim 1, wherein the input signals for the main and auxiliary amplifiers are split in digital domain such that the amplitude and/or phase of the input signals for the main and auxiliary amplifiers are controlled, respectively.

7. The power amplifier arrangement according to claim 1, wherein the power amplifier arrangement further comprises multiple switches for a dynamic time-division-duplex operation, and wherein the outputs of the multiple hybrid couplers are coupled to the respective outputs of the power amplifier arrangement via the respective switches.

8. The power amplifier arrangement according to claim 1, wherein the power amplifier arrangement is configured for operating in two frequency bands, and wherein the power amplifier arrangement comprises:

two inputs, each input is for receiving an input signal within one frequency band of the two frequency bands;

two outputs, each output is for providing an output signal within one frequency band of the two frequency bands;

two main amplifiers, wherein an input of a first main amplifier is coupled to the first input of the power amplifier arrangement and an output of the first main amplifier is coupled to the first output of the power amplifier arrangement through a first transmission line, an input of a second main amplifier is coupled to the second input of the power amplifier arrangement and an output of the second main amplifier is coupled to the second output of the power amplifier arrangement through a second transmission line;

two auxiliary amplifiers; and two hybrid couplers; and wherein inputs of the auxiliary amplifiers are coupled to the inputs of the power amplifier arrangement through the first hybrid coupler, outputs of the auxiliary amplifiers are coupled to the outputs of the power amplifier arrangement through the second hybrid coupler.

9. The power amplifier arrangement according to claim 1, wherein one main amplifier and two auxiliary amplifiers in the power amplifier arrangement form a two-way Doherty power amplifier.

10. The power amplifier arrangement according to claim 1, wherein one main amplifier and two auxiliary amplifiers in the power amplifier arrangement form a three-way Doherty power amplifier.

11. The power amplifier arrangement according to claim 10, wherein the first and second auxiliary amplifiers are biased differently such that they are turned on at different input signal power level and operate as a two-way Doherty power amplifier.

12. The power amplifier arrangement according to claim 1, wherein the power amplifier arrangement is configured as a four-band power amplifier and the power amplifier arrangement comprises:

four inputs, each input is for receiving an input signal within one frequency band of the four frequency bands;

four outputs, each output is for providing an output signal within one frequency band of the four frequency bands;

four main amplifiers, wherein inputs of the four main amplifiers are coupled to the respective inputs of the power amplifier arrangement for receiving the input signals within the respective frequency bands and outputs of the four main amplifiers are coupled to the respective outputs of the power amplifier arrangement for providing the output signals within the respective frequency bands;

four auxiliary amplifiers; and six hybrid couplers, wherein three hybrid couplers are at the inputs and three hybrid couplers are at the outputs of the power amplifier arrangement; and wherein inputs of the auxiliary amplifiers are coupled to the inputs of the power amplifier arrangement through the input hybrid couplers, outputs of the auxiliary amplifiers are coupled to the outputs of the power amplifier arrangement through the output hybrid couplers.

13. The power amplifier arrangement according to claim 1, wherein the power amplifier arrangement is configured as a dual-band power amplifier and the power amplifier arrangement comprises:

two inputs, each input is for receiving an input signal within one frequency band of the two frequency bands;

two outputs, each output is for providing an output signal within one frequency band of the two frequency bands;

two main amplifiers, wherein inputs of the two main amplifiers are coupled to the respective inputs of the power amplifier arrangement for receiving the input signals within the respective frequency bands and outputs of the two main amplifiers are coupled to the respective outputs of the power amplifier arrangement for providing the output signals within the respective frequency bands;

four auxiliary amplifiers; and six hybrid couplers, wherein three hybrid couplers are at the inputs and three hybrid couplers are at the outputs of the power amplifier arrangement; and wherein inputs of the auxiliary amplifiers are coupled to the inputs of the power amplifier arrangement through the input hybrid couplers, outputs of the auxiliary amplifiers are coupled to the outputs of the power amplifier arrangement through the output hybrid couplers.

14. A multiband power amplifier comprising one or more power amplifier arrangements according to claim 1.

15. An electronic apparatus comprising one or more power amplifier arrangements according to claim 1.

16. The electronic apparatus according to claim 15, wherein the electronic apparatus is any one of a transmitter, a transceiver, a wireless communication device, a radio base station, and a network node for a cellular communication system.

* * * * *